(12) United States Patent
Fallon et al.

(10) Patent No.: US 7,093,220 B2
(45) Date of Patent: Aug. 15, 2006

(54) METHOD FOR GENERATING CONSTRAINED COMPONENT PLACEMENT FOR INTEGRATED CIRCUITS AND PACKAGES

(75) Inventors: Elias Fallon, Pittsburgh, PA (US); Rob A. Rutenbar, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 351 days.

(21) Appl. No.: 10/674,085

(22) Filed: Sep. 29, 2003

(65) Prior Publication Data
US 2005/0028122 A1 Feb. 3, 2005

Related U.S. Application Data

(60) Provisional application No. 60/415,625, filed on Oct. 2, 2002.

(51) Int. Cl.
G06F 9/45 (2006.01)
(52) U.S. Cl. ............... 716/10; 716/1; 716/2; 716/8; 716/9
(58) Field of Classification Search .......... 716/1, 716/2, 5, 8, 9, 10, 19; 703/15; 700/171
See application file for complete search history.

(56) References Cited

U.S. PATENT DOCUMENTS

| | | | | |
|---|---|---|---|---|
| 4,554,625 A | * | 11/1985 | Otten | 700/171 |
| 6,011,911 A | * | 1/2000 | Ho et al. | 716/5 |
| 6,066,180 A | * | 5/2000 | Kim et al. | 716/19 |
| 6,161,078 A | | 12/2000 | Ganley | |
| 6,282,694 B1 | | 8/2001 | Cheng et al. | |
| 6,367,052 B1 | * | 4/2002 | Steinberg et al. | 716/2 |
| 6,389,582 B1 | * | 5/2002 | Valainis et al. | 716/9 |
| 6,550,046 B1 | | 4/2003 | Balasa et al. | |
| 6,678,644 B1 | * | 1/2004 | Segal | 703/15 |
| 2002/0184603 A1 | * | 12/2002 | Hassibi et al. | 716/2 |

OTHER PUBLICATIONS

NN8712251, "Method for Improving Geometric Packaging of Circuit Chip Modules: Utilizing Top-Down Slicing-Based Floorplanning", Dec. 1, 1987, vol. No. 30, Issue No. 7, pp. 251-253.*
Prieto et al., "A performance-driven placement algorithm with simultaneous Place&Route optimization for analog ICs", Mar. 17-20, 1997, European Design and Test Conference, ED&TC 97, pp. 389-394□□.*

(Continued)

Primary Examiner—A. M. Thompson
Assistant Examiner—Helen Rossoshek
(74) Attorney, Agent, or Firm—Morrison & Foerster LLP

(57) ABSTRACT

A method for determining component placement in a circuit includes forming a tree structure that defines the placement of each of a plurality of components associated with the tree structure on a first side, a second side or on both sides of a symmetry line, with at least one component tagged for symmetric placement on both sides of a symmetry line; performing at least one search of the tree structure to determine an initial placement of a subset of the components; and performing another search of the tree structure to determine a final placement of the subset of components whereupon at least a part of each component tagged for symmetric placement is positioned on each side of the symmetry line. The method can be embodied as instructions stored on a computer readable medium which, when executed by a processor, cause the processor to implement the method.

38 Claims, 32 Drawing Sheets

OTHER PUBLICATIONS

Kleinhans et al., "Gordian: VLSI placement by quadratic programming and slicing optimization", Mar. 1991, Computer-Aided Design of Integrated Circuits and Systems, IEEE Transactions on☐☐vol. 10, Issue 3, pp. 356-365.*

Maruvada et al., "Placement with symmetry constraints for analog layout using red-black trees", May 25-28, 2003 Circuits and Systems, 2003. ISCAS '03. Proceedings of the 2003 International Symposium on, vol. 5, pp. V-489-V-492 vol. 5.*

Florin Balasa and Koen Lampaert, "Module Placement For Analog Layout Using The Sequence-Pair Representation", Proc. ACM/IEEE Design Automation, pp. 274-279, (Jun. 1999).

Florin Balasa and Koen Lampaert, "Symmetry Within The Sequence-Pair Representation In The Context Of Placement For Analog Design", IEEE Transactions On Computer-Aided Design Of Integrated Circuits And Systems, vol. 19, No. 7, pp. 721-731 (Jul. 2000).

Florin Balasa, "Device-Level Placement For Analog Layout: An Opportunity For Non-Slicing Topological Representations", Proc. Asia-Pacific DAC (ASPDAC), pp. 281-286, (2001).

Eric Felt, Enrico Malavasi, Edoardo Charbon, Roberto Totaro and Alberto Sangiovanni-Vincentelli, "Performance-Driven Compaction For Analog Integrated Circuits", IEEE 1993 Custom Integrated Circuits Conference, pp. 17.3.1-17.3.5, (1993).

Eric Felt, Edoardo Charbon, Enrico Malavasi and Alberto Sangiovanni-Vincentelli, "An Efficient Methodology For Symbolic Compaction Of Analog IC's With Multiple Symmetry Constraints", Proc. European Design Automation Conference, pp. 148-153, (1992).

Joseph L. Ganley, "Efficient Solution Of Systems Of Orientation Constraints", In Proceedings Of The International Symposium On Physical Design, pp. 140-144, (1999).

Pei-Ning Guo, Chung-Kuan Cheng and Takeshi Yoshimura, "An O-Tree Representation Of Non-Slicing Floorplan And Its Applications", Proc. ACM/IEEE Design Automation Conference, pp. 268-273, (Jun. 1999).

En-Cheng Liu, Ming Shiun Lin, Jianbang Lai and Ting-Chi Wang, "Slicing Floorplan Design With Boundary-Constrained Modules", ISPD'01, pp. 124-129, Apr. 1-4 (2001).

Enrico Malavasi, Joseph L. Ganley and Edoardo Charbon, "Quick Placement With Geometric Constraints", IEEE 1997 Custom Integrated Circuits Conference, pp. 561-564, (May 1997).

C. Brandolese, M. Pillan, F. Salice and D. Sciuto, "Analog Circuits Placement: A Constraint Driven Methodology", IEEE, pp. 635-638, (1996).

Margherita Pillan and Donatella Sciuto, "Constraint Generation And Placement For Automatic Layout Design Of Analog Integrated Circuits", pp. 355-358.

Yingxin Pang, Florin Balasa, Koen Lampaert and Chung-Kuan Cheng, "Block Placement Symmetry Constraints Based On The O-Tree Non-Slicing Representation", Proc. ACM/IEEE Design Automation Conference, pp. 464-467, (Jun. 2000).

Juan A. Prieto, Jose M. Quintana, Adoracion Rueda and Jose L. Huertas, "An Algorithm For The Place-And-Route Problem In The Layout Of Analog Circuits", Pro. IEEE ISCAS, pp. 491-494 (1994).

D. F. Wong and C. L. Liu, "A New Algorithm For Floorplan Design", Proceedings Of The 23$^{rd}$ ACM/IEEE Design Automation Conference, pp. 101-107, (Jul. 1986).

John M. Cohn, David J. Garrod, Rob A. Rutenbar and L. Richard Carley, "Koan/Anagram II: New Tools For Device-Level Analog Placement And Routing," IEEE Journal Of Solid-State Circuits, vol. 26, No. 3, pp. 330-342, (Mar. 1991).

D. W. Jepsen and C.D. Gellat Jr., "Macro Placement By Monte Carlo Annealing", Proc. IEEE International Conference On Computer Design, pp. 495-498, (Nov. 1984).

Enrico Malavasi, Edoardo Charbon, Gani Jusuf, Roberto Totaro and Alberto Sangiovanni-Vincentelli, "Virtual Symmetry Axes For The Layout Of Analog IC's", Proc. 2$^{nd}$ ICVC, pp. 1-10, (Oct. 1991).

Jurgen M. Kleinhans, Georg Sigl, Frank M. Johannes and Kurt J. Antreich, "GORDIAN: VLSI Placement By Quadratic Programming And Slicing Optimization", IEEE Transactions On Computer-Aided Design, vol. 10, No. 3, pp. 356-365, (Mar. 1991).

Hiroshi Murata, Kunihiro Fujiyoshi, Shigetoshi Nakatake and Yoji Kajitani, "VLSI Module Placement Based On Rectangle-Packing By The Sequence-Pair", IEEE Transactions On Computer-Aided Design Of Integrated Circuits And Systems, vol. 15, No. 12, pp. 1518-1524, (Dec. 1996).

Sujoy Mitra, Sudip K. Nag, Rob A. Rutenbar and L. Richard Carley, "System-Level Routing Of Mixed-Signal ASICS in WREN", Proc. ACM/IEEE International Conference On CAD, pp. 394-399, (Nov. 1992).

R. Okuda, T. Sato, H. Onodera and K. Tamaru, "An Efficient Algorithm For Layout Compaction Problem With Symmetry Constraints", In Proc. IBBB ICCAD, pp. 148-151, (Nov. 1989).

* cited by examiner

Components A1 and A2 are symmetrically placed about the vertical symmetry line

Components A1 and A2 are symmetrically placed about the horizontal symmetry line

Fig 4
 ← One example component "R"
( prior art )
 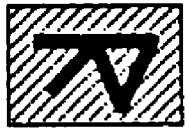  
   
8 possible geometric orientations for any component "R"
Fig 5
( prior art )

Components placed with simple symmetric pair constraint

Components placed with mirror symmetric pair constraint

Component placed with
self-symmetry constraint
(vertical symmetry line)

Component placed with
self-symmetry constraint
(horizontal symmetry line)

Component placed with
asymmetry constraint
(vertical symmetry line)

Component placed with
asymmetry constraint
(horizontal symmetry line)

Component placed with
fixed symmetric offset constraint
(vertical symmetry line)

Component placed with
fixed symmetric offset constraint
(horizontal symmetry line)

Symmetry line

Layout surface

Non-symmetric components placed

Components A1-A2, B, C1-C2 obey various symmetry constraints.

Each Group A1, A2, B1, B2 has a local symmetry line and the entire group and its symmetric sibling are placed with a group symmetric pair constraint relative to a global horizontal symmetry line

Fig. 24

| Component | Placement Constraint | Size Width | Height |
|---|---|---|---|
| A | Non-Symmetric | 2 | 2 |
| B | Non-Symmetric | 1 | 5 |
| Q | Symmetric* | 3 | 2 |
| X | Non-Symmetric | 2 | 5 |
| Y | Non-Symmetric | 1 | 5 |

\* Component can be designated for pair-symmetric, self-symmetric, asymmetric, or fixed symmetric offset placement.

☐ = place on left side of global symmetry line 24

⌐ ¬
└ ┘ = place on right side of global symmetry line 24

▨ = place pair symmetrically on both sides of global symmetry line 24

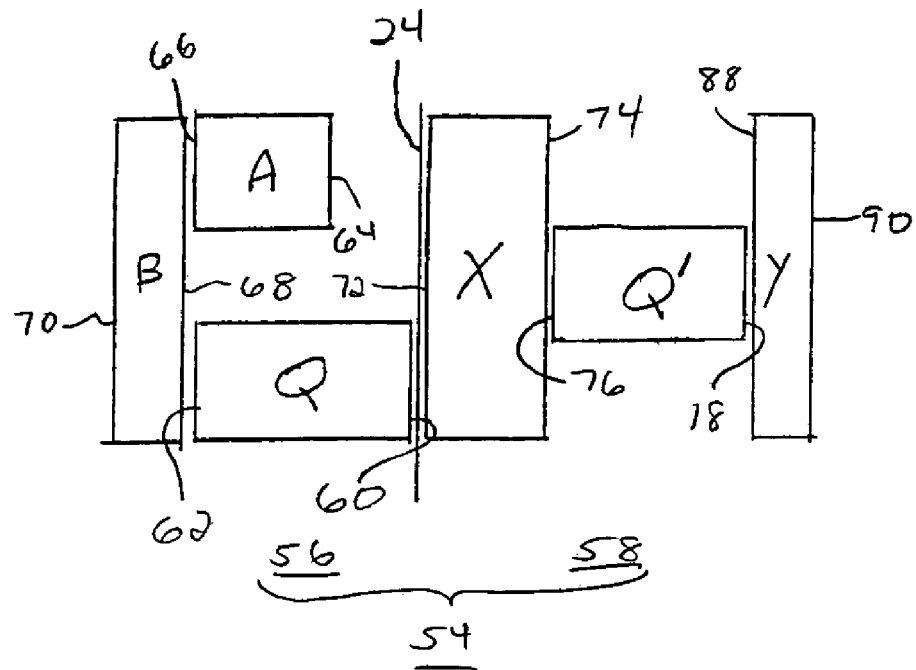
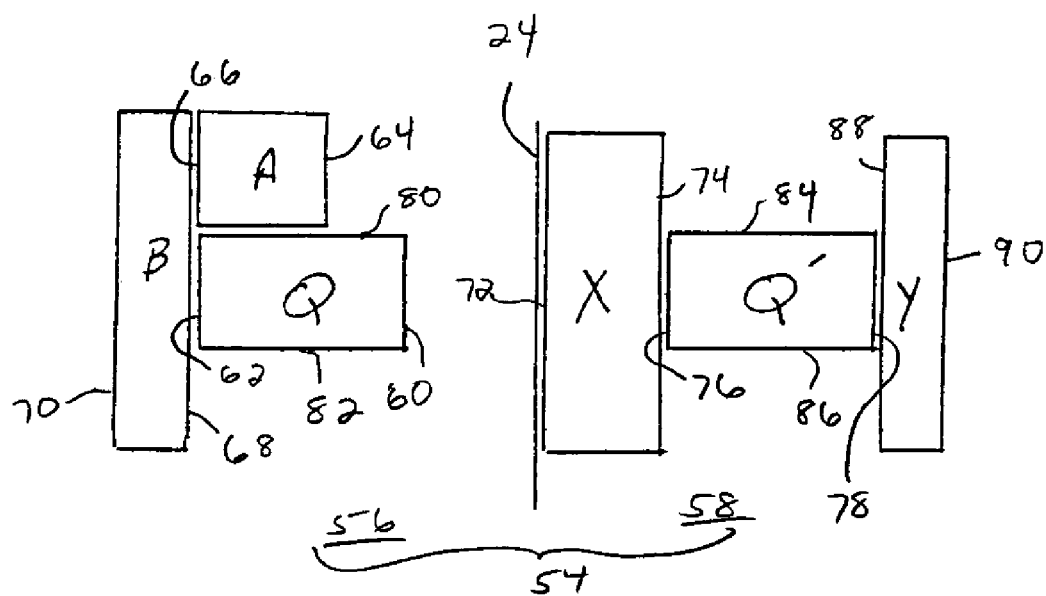

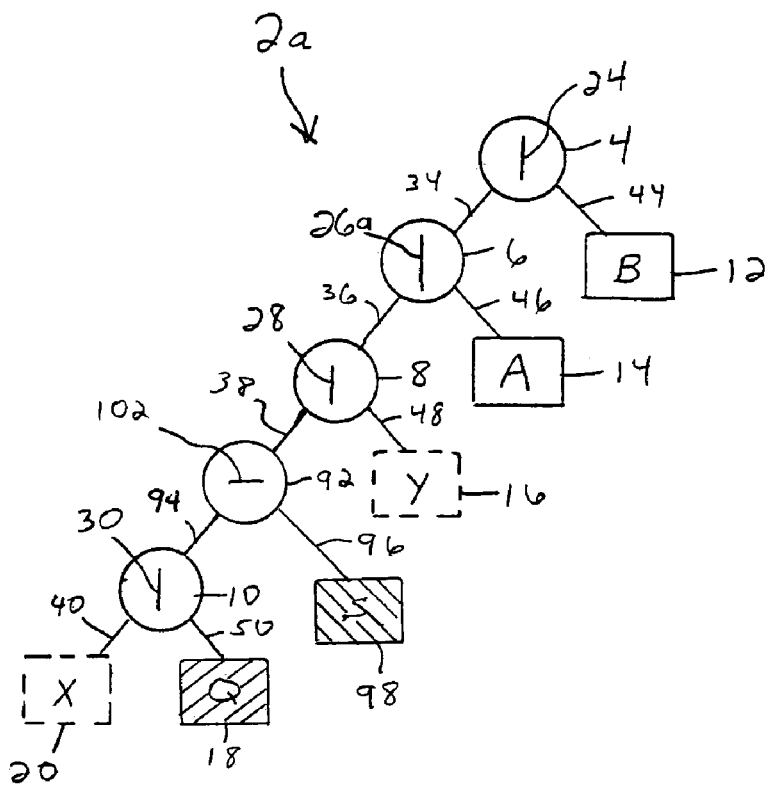
Fig 28
□ = place on left side of global symmetry line 24
⌐ ⌐ = place on right side of global symmetry line 24
└ ┘
= place pair-symmetrically on both sides of global symmetry line 24
= place self-symmetrically on both sides of global symmetry line 24

☐ = place on left side of global symmetry line 24

⌐ ¬ = place on right side of global symmetry line 24
└ ┘

▨ = place pair-symmetrically on both sides of global symmetry line 24

▧ = place self-symmetrically on both sides of global symmetry line 24

▥ = place Asymmetrically on both sides of global symmetry line 24

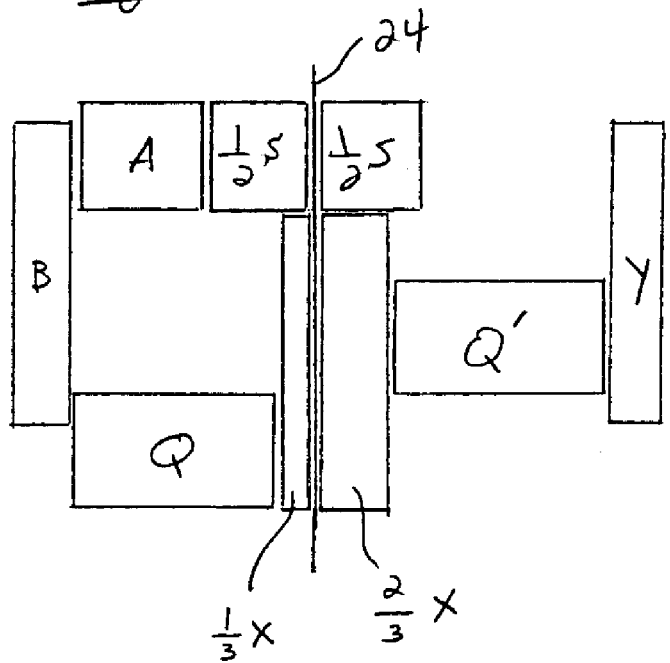
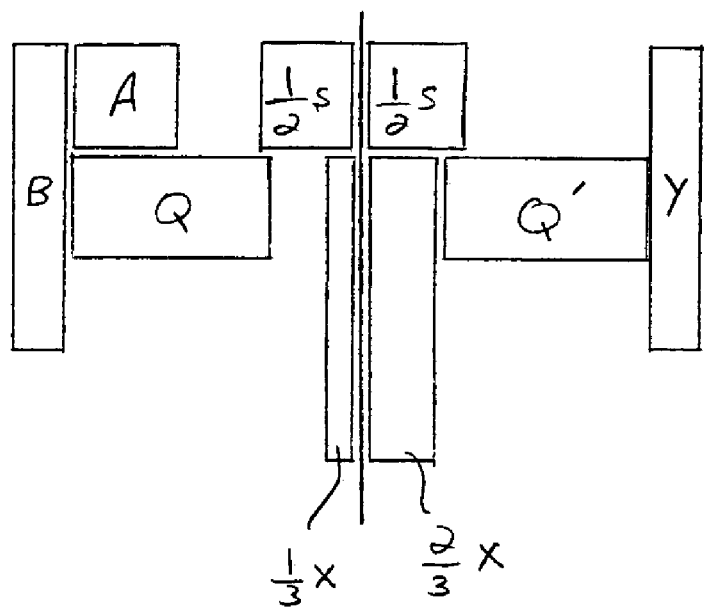

Fig 34
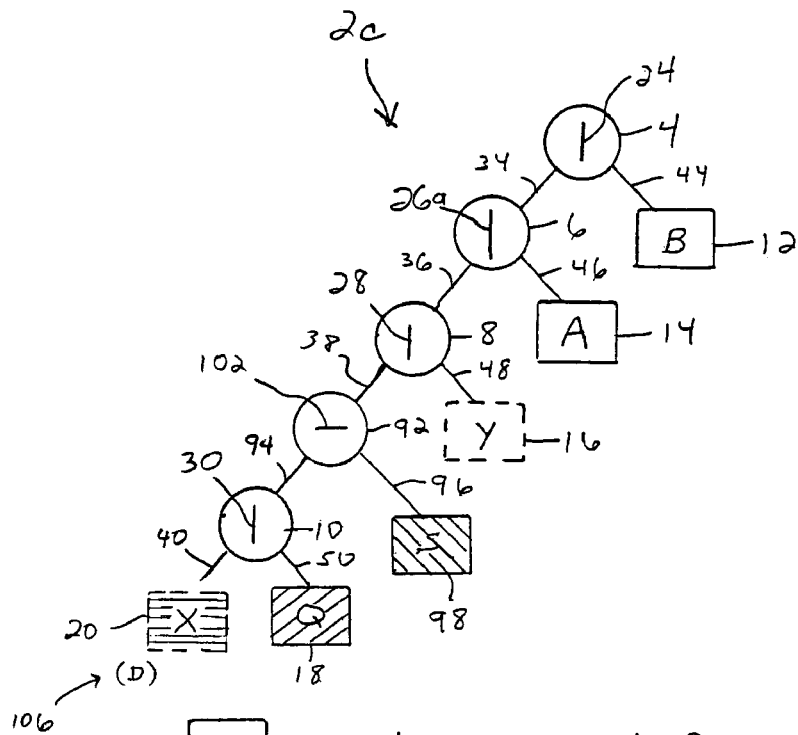
= place on left side of global symmetry line 24
= place on right side of global symmetry line 24
= place pair-symmetrically on both sides of global symmetry line 24
= place self-symmetrically on both sides of global symmetry line 24
= place fixed symmetric offset to one side of global symmetry line 24 (dashed outline = place on rigth side; solid outline = place on left side)

□ = place on left side of global symmetry line 24

┌─ ─┐
└─ ─┘ = place on right side of global symmetry line 24

▨ = place pair symmetrically on both sides of global symmetry line 24

☐ = place on left side of global symmetry line 24

⌞ ⌝ = place on right side of global symmetry line 24

▨ = place pair symmetrically on both sides of global symmetry line 24

☐ = place on left side of global symmetry line 24

⌐ ⌐
└ ┘ = place on right side of global symmetry line 24

▨ = place pair symmetrically on both sides of global symmetry line 24

Fig 47
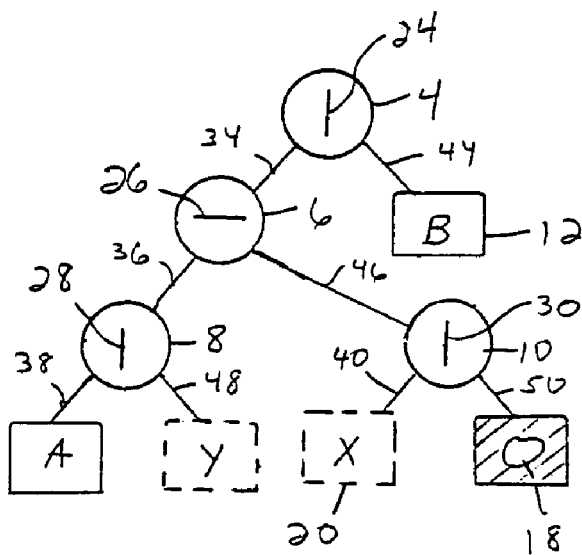
 = place on left side of global symmetry line 24
☐ = place on right side of global symmetry line 24
▨ = place pair symmetrically on both sides of global symmetry line 24

US 7,093,220 B2

METHOD FOR GENERATING CONSTRAINED COMPONENT PLACEMENT FOR INTEGRATED CIRCUITS AND PACKAGES

CROSS REFERENCE TO RELATED APPLICATIONS

This application claims priority from U.S. Provisional Patent Application No. 60/415,625, filed Oct. 2, 2002.

BACKGROUND OF THE INVENTION

1. Field of the Invention

The present invention relates to circuit design and, more particularly, to component placement in a circuit design.

2. Description of the Prior Art

Integrated circuit and electronic board/package design is subject to complex geometric and electrical rules governing the allowed placement of components. Component placements which fail to abide by these rules may occupy too much area to be economically manufactured, achieve levels of desired performance far below those specified at the outset of the design process, or even fail to perform their desired function correctly.

A "component" may be an individual electronic device (for example, a transistor) or a set of pre-placed devices to be treated as a single, atomic placeable object. A "group" may be a hierarchy of placed components, such as several devices of a sub-circuit, or several sub-circuits placed in a circuit to also be treated as single, atomic object.

A component is conventionally specified by a rectilinear, typically rectangular, outline which completely encompasses its internal geometry and any extra space that must be included around the exterior of the component to ensure compliance with manufacturing rules that specify allowable distances between components. The result of geometrically arranging a plurality of such components on the surface of an IC chip or a board is called a "placement", or a "layout", or a "floorplan".

It is conventional to optimize component placements to minimize some combination of the overall area of a layout, the length of conducting wires (also called "nets") that connect the components, and the delay to propagate an electrical signal along selected paths of the longest wires in the design. For placement of digital components, strategies of this type often suffice. However, for placements intended to create layouts that incorporate non-digital components, for example, analog components, mixtures of analog and digital components (called "mixed-signal" designs), radio-frequency components ("RF") and microwave-frequency components, among others, additional geometric constraints are often imposed. These additional geometric constraints maximize the precision with which various electrical quantities (current, voltage, charge, capacitance, inductance, etc.) may be created or manipulated by these placed components, thus enhancing the likelihood of correct electrical function of the final manufactured design.

These geometric constraints come in several well-known styles. The geometric placement constraint styles of relevance to the present invention include symmetries, groups and isolation structures.

Symmetries:

Numerous prior art techniques exist for generating a layout of components when no symmetry, grouping, and/or isolation constraints are present. These conventionally comprise a method to represent the location of each placed component and a method to iteratively perturb or amend this representation to incrementally improve it to a best-quality placement, as measured by a cost function that quantifies the goodness of the placement.

The present invention is a new method for placement that supports standard prior art placement goals for digital components, e.g., wirelength, area, etc., and also supports symmetry, grouping and isolation requirements often associated with analog components.

With reference to FIG. 1, a placement problem typically comprises a set of arrangeable components that may each (for simplicity of description) be treated as rectangular objects. These rectangular objects must be arranged on a layout surface which itself can be treated as a rectangle.

Individual components carry geometric rules that determine the minimum allowed proximity (distance) to each other individual component. In particular, it is normal that placed components may not overlap. The process of "placement" assigns to each rectangular component an absolute (x, y) location, indexed relative to x (horizontal) and y (vertical) coordinate axes suitably defined for the layout surface itself.

With reference to FIG. 2, symmetry constraints impose mirror-like placement constraints on pairs of components. The two elements in the pair are referred to as siblings. A distinguished line segment—called a symmetry line—defines an axis of symmetry for the constraint.

In the simplest form of symmetry, a pair-symmetric constraint mandates that a pair of identical components must be placed as "mirror reflections" of each other about the symmetry line. For a vertical symmetry line, this means identical y (vertical) coordinates, but x coordinates that locate each component an identical distance D away from the symmetry line.

With reference to FIG. 3, and with continuing reference to FIG. 2, the symmetry line can be horizontal or vertical. To this end, the roles of the x and y coordinate values can be interchanged. A distinguished line segment again defines an axis of symmetry for the constraint, only now, this symmetry line is horizontal with respect to the layout surface. For a horizontal symmetry line, this means identical x (horizontal) coordinates, but y coordinates that locate each component an identical distance D away from the central symmetry line.

With reference to FIG. 4, in addition, the pair of components may be required to be in a specific relative orientation with respect to the symmetry line. This can apply for either the vertical or horizontal cases. Any geometric object being placed on a two-dimensional layout surface can be rotated or reflected into one of the eight unique orientations shown in FIG. 5. Pair-symmetric constraints can also optionally mandate the orientation of each component of the pair.

In addition, the pair of components may be required to be in a specific relative orientation with respect to the symmetry line. This can apply for either the vertical or horizontal cases. As shown in FIG. 6, simple pair-symmetric orientation requires the components to be arranged in identical orientations on each side of the line. (Identical left-right orientation for vertical symmetry lines or identical top-bottom orientation for horizontal symmetry lines). However, as shown in FIG. 7, mirror pair-symmetric orientation requires the components to be arranged as mirror images with respect to the symmetry line. (Left-right reversal across a vertical symmetry line or top-bottom reversal across a horizontal symmetry line).

Another type of symmetry constraint, shown in FIGS. 8 and 9, is a self-symmetry constraint. This requires a single component to have its center coordinate located on the symmetry line. Thus, the self-symmetric component extends a distance D on each side of the symmetry line. As shown in FIGS. 8 and 9, self-symmetry can be applied to either a vertical symmetry line or a horizontal symmetry line. As with the case of the pair-symmetric constraint, an optional orientation constraint may be imposed on the single self-symmetric component.

With reference to FIGS. 10 and 11, another type of symmetry constraint is an asymmetry constraint. This requires a single component to have an internal coordinate other than its center point located on the symmetry line. Thus, the asymmetric component extends a distance D1 on one side of the symmetry line and a distance D2 on the other side of the symmetry line, where D1+D2 equals the dimension of the component perpendicular to the symmetry line.

As shown in FIGS. 10 and 11, asymmetry can be applied to either a vertical or a horizontal symmetry line. As with the case of the pair-symmetric constraint, an optional orientation constraint may be imposed on the single asymmetric component.

With reference to FIGS. 12 and 13, another type of symmetry constraint is a fixed symmetric offset constraint. This requires a single component to not overlap the symmetry line but, instead, be separated from the symmetry line by a precise ("fixed") distance D. Thus, the fixed symmetric offset component is exactly a distance D away on one side of the symmetry line. Another required element of the fixed symmetric offset constraint is which side of the symmetry line the component is required to reside in. As shown in FIGS. 12 and 13, fixed symmetric offset constraints can appear with either vertical or horizontal symmetry lines. As with the case of other symmetry constraints, an optional orientation constraint may be imposed on the component.

With reference to FIG. 14, components that do not participate in any symmetry constraints are referred to as non-symmetric. Symmetric and non-symmetric components can co-exist in the same placement on the same layout surface. As shown in FIG. 15, multiple different symmetry lines can also co-exist on a single layout surface. Individual components will be identified as either non-symmetric or bound to a particular symmetry line. When the symmetry line extends across the entire layout surface, it is referred to as a global symmetry line. When the symmetry line extends only across a portion of the layout surface, it is referred to as a local symmetry line. Multiple local and global, horizontal and vertical symmetry lines can arbitrarily co-exist on the same layout surface, each with an arbitrary collection of components with arbitrary symmetry constraints imposed on them.

Groups:

With reference to FIGS. 16 and 17, group constraints require sets of individual components to be placed near each other. In addition, group constraints define, for the set of components in a group, a minimum bounding rectangle. This rectangle defines the components of the group, and imposes the additional constraint that no component that is not part of the group can be placed inside this rectangle.

With reference to FIG. 18, the minimum bounding rectangle of a group can be treated like a single placeable component. Thus, groups can also have symmetry constraints. A pair of identical groups can form a symmetric pair. A single group can be self-symmetric, asymmetric, non-symmetric, or can have a fixed symmetric offset. Groups can be bound to local or global symmetry lines, and horizontal or vertical symmetry lines.

With reference to FIG. 19, the minimum bounding rectangle of a group can also or alternatively be treated like it was the layout surface itself. Thus groups can also have internal, local symmetry lines. Components inside of a group can be bound to this local symmetry line or they can be non-symmetric. The local symmetry line can be group-global, namely, it traverses the entire dimension of the group, or it can be group-local, namely, it traverses partially but not entirely across one dimension of the group. A single group can have any number of such internal symmetry lines. A group with internal symmetries can itself be treated as a single minimum bounding rectangle that obeys any symmetry constraint. These are referred to as hierarchical symmetry constraints.

Isolation Structures:

With reference to FIGS. 20 and 21, isolation constraints handle situations where individual or hierarchical placed components or groups may be electrically sensitive to disruption from other components or groups placed nearby. One mechanism for mitigating this problem is to add a special, isolation structure around portions of the perimeter of each sensitive component. These isolation structures appear as geometric bands around portions or all of the perimeter of a component, increasing its size, and changing its spacing rules with respect to other placed components or groups.

With reference to FIGS. 22 and 23, groups can also have isolation constraints. For groups, these isolation structures appear as geometric bands around portions or all of the perimeter of the group's minimum bounding rectangle, changing its geometric size and spacing rules with respect to other placed components or groups.

All of these three styles of constraints, namely, symmetries, groups and isolation structures, can co-exist in one placement. Individual components may participate in symmetry constraints, be parts of groups, or have individual isolation structures. Likewise, groups themselves can have internal symmetries, participate in group/hierarchical symmetries external to themselves, and have group-level isolation structures. Groups can be nested inside each other to define arbitrary layout hierarchies.

Many prior art methods exist for generating a layout of components when symmetry, grouping, and isolation constraints are not needed. These conventionally comprise a method to represent the location of each placed component, and a method to iteratively perturb this representation to incrementally improve it to a best-quality placement, as measured by an auxiliary cost function.

These prior art methods, however, do not work when the presence of arbitrary combinations of symmetry, grouping, or isolation constraints exist. While prior art methods exist that partially address some of these constraints, all of the prior art methods for handling symmetries suffer from at least one of the following problems:

They cannot guarantee the ultimate geometric legality of the placement, e.g., components may overlap;

They cannot guarantee that all symmetry constraints are satisfied in the final placement;

The process of evaluating the feasibility of satisfying all symmetries for each placement solution candidate is inefficient, e.g., quadratic in the number of components;

They cannot support the full range of required constraints required, namely, self and pair symmetry, asymmetry and non-symmetry, fixed symmetric offsets, groups, group and hierarchical symmetries, isolation structures for components and groups.

The present invention overcomes the above problems and others by providing a method that utilizes a novel data structure called a tree structure that supports all of the foregoing constraints. Every placement solution candidate generated during iterative improvement will satisfy all the constraints. The method of generating these solution candidates, and the method of evaluating the cost function which determines the quality of each solution candidate, are both novel and efficient. The method requires only a single binary tree data structure with suitable annotations. Evaluating the quality of any placement solution requires only searches of this tree structure. In particular, the method does not require the construction of any secondary or auxiliary data structures to check that the constraints can be met, or to evaluate the cost of a placement.

SUMMARY OF THE INVENTION

The invention is a computer-implemented method for determining component placement in a circuit formed on a substrate, such as a printed circuit board or a semiconductor, i.e., an integrated circuit. The method includes (a) receiving a plurality of components, with each component having associated therewith a width, a height and one of a symmetric and a non-symmetric placement constraint and (b) creating a tree structure that expresses the placement constraints for the plurality of components. The tree structure includes a global root node that represents a global symmetry line, a leaf representing each component, with the component associated with each leaf tagged for placement on a first side, a second side, or on both sides of the global symmetry line, and at least one interior node that represents a slicing line that establishes a relative placement of at least two components with respect to each other on the same side of the global symmetry line. The method further includes (c) performing at least one structured search of the tree structure to determine the initial placement of components on the first side, the second side or both sides of the global symmetry line based on the tagging of each component and the connections of the leaves, the global node and the interior nodes to form the tree structure; and (d) performing another structured search of the tree structure to determine the final placement of components based on at least one of the widths and heights of the components.

Each structured search can be a depth-first search. Each slicing line can have a direction that is parallel or perpendicular to the global symmetry line and step (c) can include the placement of said at least two components with respect to each other as a function of the direction of the slicing line.

Step (c) can include, for components tagged for placement on the same side of the global symmetry line, placing a component associated with a leaf positioned lower in the tree structure closer to the global symmetry line than a component associated with a leaf positioned higher in the tree structure. Each node can have a pair of branches descending therefrom and each branch can couple the node from which it descends to (1) one of the interior nodes, (2) one of the leaves, or (3) a null.

Step (c) can include, for an interior node that represents a slicing line that is parallel to the global symmetry line, placing on one side of the global symmetry line, a first component which is tagged for such placement and which is represented by a leaf which is connected to said interior node via one of its branches and placing on a side of the first component opposite the global symmetry line a second component which is tagged for placement on the one side of the global symmetry line and which is represented by a leaf which is connected to said interior node via the other of its branches.

At least one of the leaves representing the first and the second components can be connected directly to said interior node.

Step (c) can include, for the global root node, placing a first component which is tagged for placement on one side of the global symmetry line and which is represented by a leaf which is connected to said global root node via one of its branches and placing on a side of the first component opposite the global symmetry line, a second component which is tagged for placement on the one side of the global symmetry line and which is represented by a leaf which is connected to said global root node via the other of its branches.

At least one of the leaves representing the first and second components can be connected directly to the global root node.

Step (c) can include, for an interior node that represents a slicing line that is perpendicular to the global symmetry line, placing on one side of the global symmetry line, a first component which is tagged for such placement and which is represented by a leaf which is connected to said interior node via one branch descending therefrom and placing above or below the first component, a second component which is tagged for placement on the one side of the global symmetry line and which is represented by a leaf which is connected to said interior node via the other branch descending therefrom.

Step (d) can include placing one edge of a component adjacent the global symmetry line when the leaf representing said component is (1) connected to an interior node at the lowest level of the tree structure via one branch descending from said interior node or (2) connected to said interior node via the other branch descending therefrom and no other leaf is connected to said interior node via the one branch descending therefrom.

For each component tagged for placement on both sides of the global symmetry line in a pair-symmetric manner, step (c) includes placing first and second copies of said component on the respective first and second sides of the global symmetry line, with each copy of the component having a side closest to the global symmetry line positioned a distance D therefrom.

The distance D can be zero when the leaf representing the component tagged for pair-symmetric placement is connected directly to a node at the lowest level of the search tree. Alternatively, the distance D can be the greater of (1) a sum of the width(s) or height(s) of each component placed on the first side of the global symmetry line prior to placement of copies of the component tagged for pair-symmetric placement or (2) a sum of the width(s) or height(s) of each component placed on the second side of the global symmetry line prior to placement of copies of the component tagged for pair-symmetric placement.

For each component tagged for placement on both sides of the global symmetry line in a self-symmetric or asymmetric manner, step (c) includes placing a first part of said component on the first side of the global symmetry line and placing a second part of said component on the second side of the global symmetry line. For each component tagged for self-symmetric placement, the first part of the component is one-half of the component and the second part of the component is the other half of the component. For each component tagged for asymmetric placement, the first part of the component is a first percentage of said component, the second part of the component is a second percentage of said component, and the sum of the first and second percentages equal one-hundred percent.

For each component tagged for offset symmetric placement on one side of the global symmetry line a distance D from the global symmetry line, step (c) includes placing said component on the one side of the global symmetry line with the side of said component in opposition with the global symmetry line positioned the distance D from the global symmetry line.

The method can further include defining an isolation structure along at least one side of at least one component and, in step (d), placing the one side of said at least one component no closer to another component or the global symmetry line than said isolation structure.

The method can further include amending the tree structure in at least one of the following manners: (1) changing a direction of at least one slicing line; (2) re-tagging at least one component from placement on the first side of the global symmetry line to placement on the second side of the global symmetry line, or vice versa; (3) exchanging the location of two components in the tree structure; (4) exchanging the position of two nodes in the tree structure; (5) exchanging the location of one leaf and one node, including any node and/or leaf connected to said one node; and/or (6) exchanging the width and height of a component associated with at least one leaf. Once the tree structure is amended, steps (c) and (d) can be repeated for the amended tree structure.

The tree structure can include a group which is tagged for placement on the first side, the second side, or both sides of the global symmetry line. The group can include a group tree structure having at least one leaf connected to a local root node that represents a local symmetry line. The component associated with each leaf of the group tree structure can be tagged for placement on a first side, a second side, or on both sides of the local symmetry line. The method can further include performing at least one structured search of the group tree structure to determine an initial placement of each component thereof on the first side, the second side or both sides of the local symmetry line based on the tagging thereof, and performing another structured search of the group tree structure to determine a final placement of each component thereof based on at least one of the widths and the heights of the components.

The group tree structure can include at least one local interior node connected between the local root node and the at least one leaf. The step of performing at least one structured search of the group tree structure can include placing at least two components associated with the group tree structure with respect to each other as a function of a direction of a slicing line represented by the at least one local interior node of the group tree structure.

Step (c) can include performing the at least one structured search of the tree structure to determine the initial placement of the group on the first side, the second side, or both sides of the global symmetry line based on the tagging thereof, and step (d) can include performing the other structured search of the tree structure to determine the final placement of the group. Step (d) can also include substituting for the final placement of the group the final placement of the components associated therewith.

The local root node can be connected directly to either the root node or one of the interior nodes of the tree structure. The at least one leaf of the group tree structure can be connected directly to the local root node.

The invention is also a computer-implemented method for determining component placement in an integrated circuit. The method includes (a) receiving a plurality of components each having one of a symmetric and a non-symmetric placement constraint associated therewith and (b) creating a tree structure that expresses the placement constraints for the plurality of components, the tree structure including a plurality of nodes and a plurality of leaves. The plurality of nodes includes a global root node that represents a global symmetry line and a local root node connected to the global root node. The local root node represents a local symmetry line, and the local root node and at least one leaf connected thereto define a group tree structure which is tagged for placement on a first side, a second side or on both sides of the global symmetry line. Each leaf represents one of the components, with the component associated with each leaf of the group tree structure tagged for placement on a first side, a second side or on both sides of the local symmetry line, with the component associated with each leaf of the group tree structure having at least one of a height and a width associated therewith. The method further includes (c) performing at least one structured search of the group tree structure to determine the initial placement of components thereof on the first side, the second side or both sides of the local symmetry line based on the tagging of each component and (d) performing another structured search of the group tree structure to determine the final placement of the components thereof based on at least one of the widths and heights of the components.

The method can further include performing at least one structured search of the tree structure to determine the initial placement of the group tree structure on the first side, the second side or both sides of the global symmetry line based on the tagging of the group tree structure, and performing another structured search of the tree structure to determine the final placement of the group tree structure.

The method can further include substituting the final placement of the components of a group tree structure for the final placement of the group tree structure.

The invention is also a computer-implemented method for determining component placement in an integrated circuit. The method includes (a) forming in the memory of the computer a tree structure that defines the placement of each of a plurality of components associated with the tree structure on a first side, a second side, or symmetrically on both sides of a symmetry line, with at least one component tagged for symmetric placement on both sides of a symmetry line; (b) performing at least one search of the tree structure to determine an initial placement of a subset of the components on the first side, the second side, or on both sides of the symmetry line; and (c) performing another search of the tree structure to determine a final placement of the subset of components, wherein at least a part of each component tagged for symmetric placement is positioned on each side of the symmetry line.

Each search can be a depth-first search. The tree structure can have a leaf for each component and at least one node connecting the leaves. The initial placement of the components occurs as a function of placement information, e.g., a vertical or horizontal line, associated with at least one node of the tree structure.

The method can further include (d) forming a new tree structure in at least one of the following manners: (1) amending the placement information associated with at least one of the nodes of the tree structure; (2) amending the tree structure to re-define the placement of at least one component from one side of the symmetry line to the other side of the symmetry line; (3) exchanging the location of two leaves in the tree structure; (4) exchanging the location of two nodes in the tree structure; (5) exchanging the location of a leaf and a node in the tree structure; and/or (6) exchanging the width and height of a component associated with a leaf of the tree structure. Steps (b) and (c) can then be repeated for the new tree structure.

Steps (d) and (e) can be repeated a plurality of times. For each tree structure, a cost can be determined that is related to the goodness of the final placement of the subset of components made utilizing said tree structure. The tree structure having the most favorable cost associated therewith can be selected for implementation of the final placement of the subset of components.

One way to determine the cost for each tree structure includes determining a ratio of (1) a total area of the subset of components in the final placement and (2) a total area of a rectangle that bounds the subset of components in the final placement.

The invention is also a computer readable medium having stored thereon instructions which, when executed by a processor, cause the processor to (a) receive data regarding a plurality of components, with the data for each component having associated therewith a width, a height and one of a symmetric and a non-symmetric placement constraint for the component and (b) create a tree structure that expresses the placement constraints for the plurality of components. The tree structure can include a global root node that represents a global symmetry line; a leaf representing each component, with the component associated with each leaf tagged for placement on a first side, a second side, or on both sides of the global symmetry line; and at least one interior node that represents a slicing line that establishes a relative placement of at least two components with respect to each other on the same side of the global symmetry line. The instructions can also cause the processor to (c) perform at least one structured search of the tree structure to determine the initial placement of components on the first side, the second side or both sides of the global symmetry line based on the tagging of each component and (d) perform another structured search of the tree structure to determine the final placement of components based on at least one of the widths and heights of the components.

The invention is also a computer readable medium having stored thereon instructions which, when executed by a processor, cause the processor to (a) receive data regarding a plurality of components, with the data for each component including one of a symmetric and a non-symmetric placement constraint for the component and (b) create a tree structure that expresses the placement constraints for the plurality of components, the tree structure including a plurality of nodes and a plurality of leaves wherein: the plurality of nodes includes a global root node that represents a global symmetry line and at least one local root node connected to the global root node; the local root node represents a local symmetry line; a group tree structure includes the local root node and at least one leaf connected thereto; the group tree structure is tagged for placement on a first side, a second side or on both sides of the global symmetry line; and each leaf represents one of the components, with the component associated with each leaf of the group tree structure tagged for placement on a first side, a second side or on both sides of the local symmetry line, with the component associated with each leaf of the group tree structure having at least one of a height and a width associated therewith. The instructions can also cause the processor to (c) perform at least one structured search of the group tree structure to determine the initial placement of components thereof on the first side, the second side or both sides of the local symmetry line based on the tagging of each component and (d) perform another structured search of the group tree structure to determine the final placement of the components thereof based on at least one of the widths and heights of the components.

Lastly, the invention is a computer readable medium having stored thereon instructions which, when executed by a processor, cause the processor to (a) form in the memory of the computer a tree structure which defines the placement of each of a plurality of components associated with the tree structure on a first side, a second side, or symmetrically on both sides of a symmetry line, with at least one component tagged for symmetric placement on both sides of a symmetry line; (b) perform a search of the tree structure to determine an initial placement of a subset of the components on the first side, the second side, or on both sides of the symmetry line; and (c) perform another search of the tree structure to determine a final placement of the subset of components, wherein at least one of a copy of or a part of each component tagged for symmetric placement is positioned on each side of the symmetry line.

The instructions can further cause the processor to (d) form a new tree structure in at least one of the following manners: (1) amend component placement information associated with at least one of the nodes of the tree structure; (2) amend the tree structure to re-define the placement of at least one component from the one side of the symmetry line to the other side of the symmetry line; (3) exchange the positions of two leaves in the tree structure; (4) exchange the positions of two nodes in the tree structure; (5) exchange the positions of a leaf and a node in the tree structure; and/or (6) exchange the width and height of a component associated with a leaf of the tree structure. Steps (b) and (c) can be repeated for the new tree structure.

The instructions can also cause the processor to repeat steps (d) and (e) a plurality of times; determine for each tree structure a cost that is related to the goodness of the final placement of the subset of components made utilizing said tree structure; and select for implementation the final placement of the subset of components made utilizing the tree structure having the most favorable cost associated therewith.

BRIEF DESCRIPTION OF THE DRAWINGS

FIG. 4 shows one example of a geometric orientation of a component R;

FIG. 5 shows eight possible geometric orientations for component R in FIG. 4;

FIG. 24 is a list of components, including for each component a placement constraint and a size, for placement in a layout surface;

FIGS. 26 and 27 are respective initial and final layouts of the components of FIG. 24 determined from searches of the tree structure shown in FIG. 25;

FIG. 28 is a variation of the tree structure shown in FIG. 25;

FIGS. 32 and 33 are respective initial and final layouts of the components of the tree structure of FIG. 31 determined from searches thereof;

FIG. 34 is a variation of the tree structure shown in FIG. 31;

FIG. 47 shows another variation of the tree structure shown in FIG. 25; and

DETAILED DESCRIPTION OF THE INVENTION

The present invention will be described with reference to the accompanying figures where like nomenclature refer to like elements. Moreover, the terms left, right, top, bottom, horizontal, vertical and the like are used with reference to the accompanying figures and are not to be construed as limiting the invention.

The present invention is embodied in computer readable program code that executes on a processor of a stand-alone or networked computer or workstation that includes a processor, computer storage, an input/output system, a media drive, such as a disk drive, CD ROM drive, etc., and a computer-useable storage medium capable of storing the computer software that embodies the present invention. Under the control of the computer readable program code, the processor is capable of configuring and operating the computer system in a manner to implement the present invention. Computer systems of the type described above are well known in the art and have not been described herein for purpose of simplicity.

With reference to FIG. 24, the computer system receives as input a plurality of components, e.g., A, B, Q, X and Y, with each component having a placement constraint and a size, e.g., height and width, associated therewith. Each placement constraint can designate the component associated therewith for either non-symmetric placement or symmetric placement. Moreover, each symmetric placement constraint can further designate the component associated therewith for pair-symmetric placement, self-symmetric placement, asymmetric placement or fixed symmetric offset placement. Each of these placement constraints will be described in greater detail hereinafter.

Figure 1:
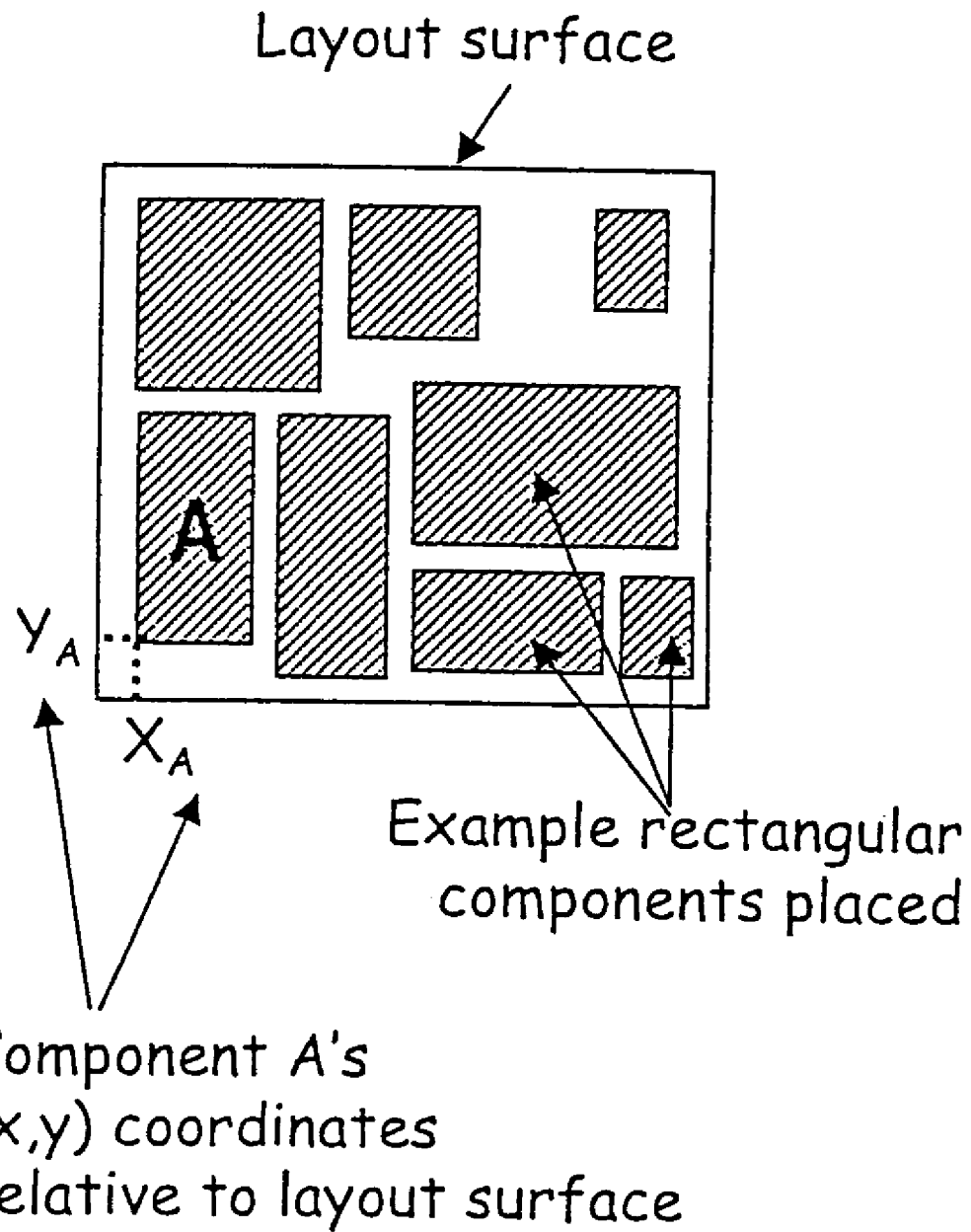
FIG. 1 shows an exemplary placement of rectangular components in a layout surface.
Figure 2:
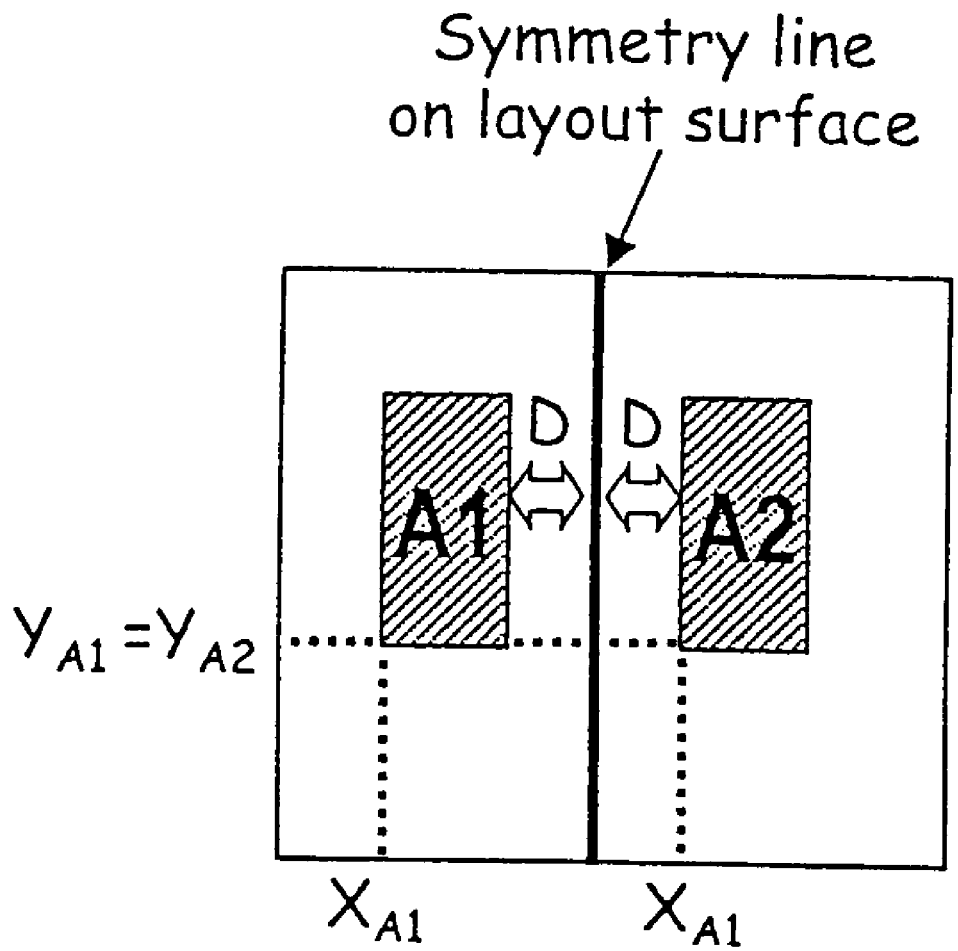
FIG. 2 shows a symmetric placement of components A1 and A2 on opposite sides of a vertical symmetry line in a layout surface.
Figure 3:
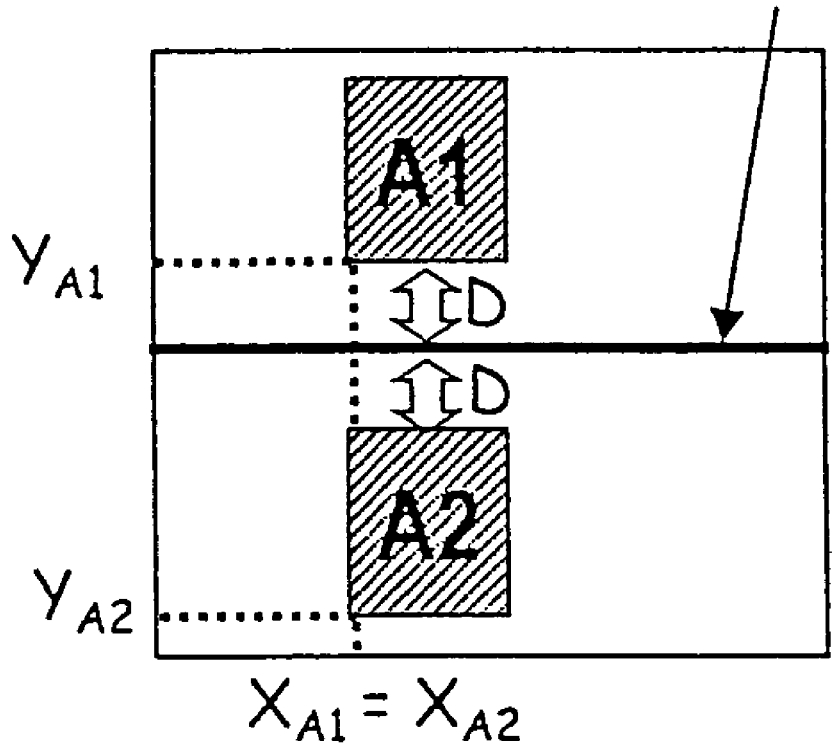
FIG. 3 shows a symmetric placement of components A1 and A2 on opposite sides of a horizontal symmetry line in a layout surface.
Figure 6:
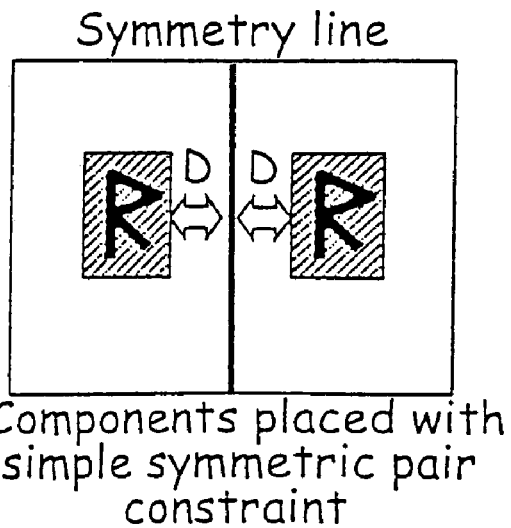
FIG. 6 shows a simple pair-symmetric placement of copies of component R on opposite sides of a vertical symmetry line.
Figure 7:
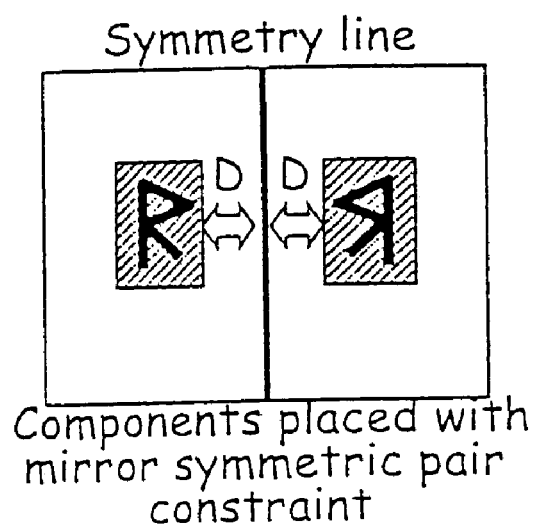
FIG. 7 shows a mirror image pair-symmetric placement of copies of component R on both sides of a vertical symmetry line.
Figure 8:
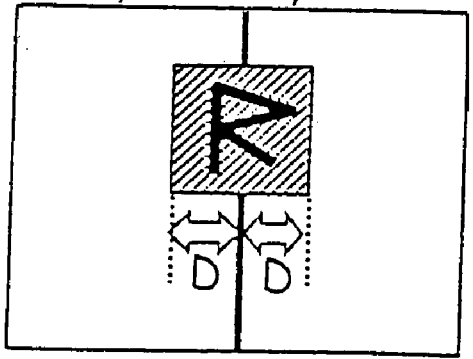
FIG. 8 shows a self-symmetric placement of component R on a vertical symmetry line.
Figure 9:
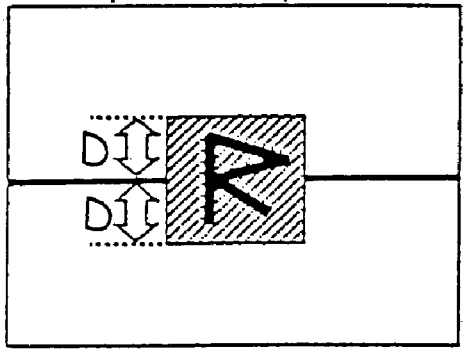
FIG. 9 shows a self-symmetric placement of component R on a horizontal symmetry line.
Figure 10:
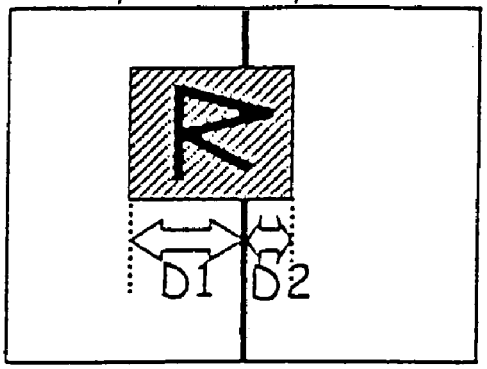
FIG. 10 shows an asymmetric placement of component R on a vertical symmetry line.
Figure 11:
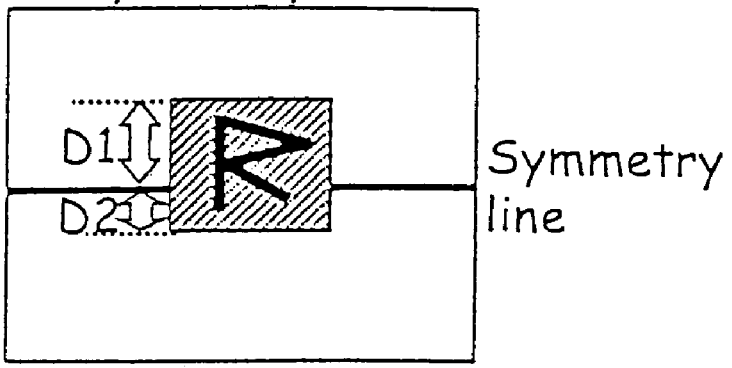
FIG. 11 shows an asymmetric placement of component R on a horizontal symmetry line.
Figure 12:
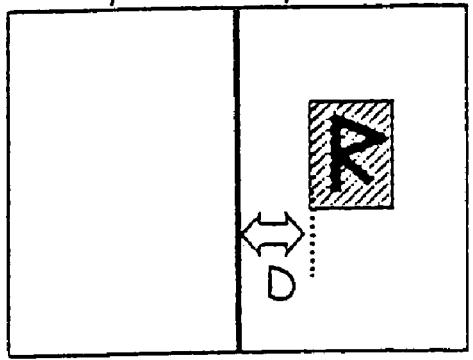
FIG. 12 shows the placement of component R a fixed symmetric offset from a vertical symmetry line.
Figure 13:
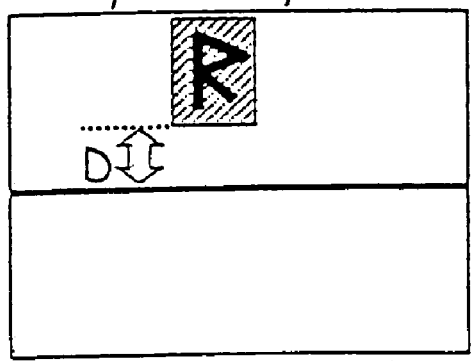
FIG. 13 shows the placement of component R a fixed symmetric offset from a horizontal symmetry line.
Figure 14:
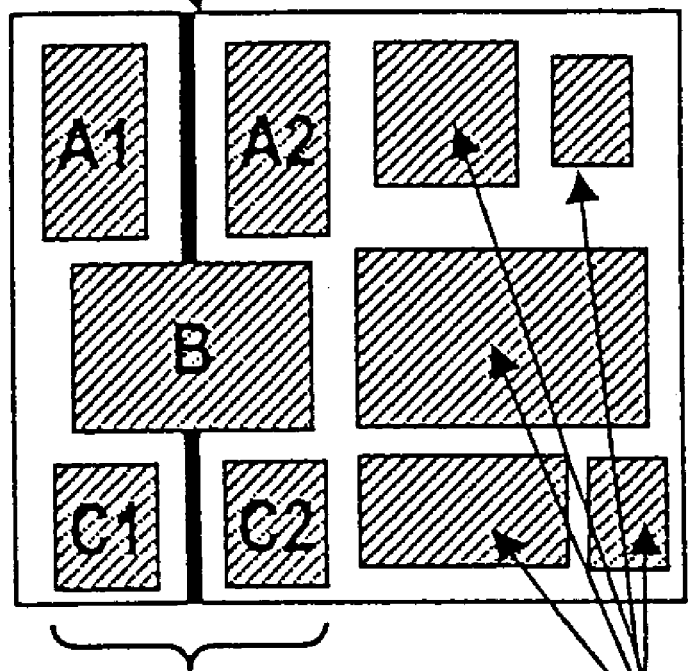
FIG. 14 shows a layout of symmetric and non-symmetric components in a layout surface.
Figure 15:
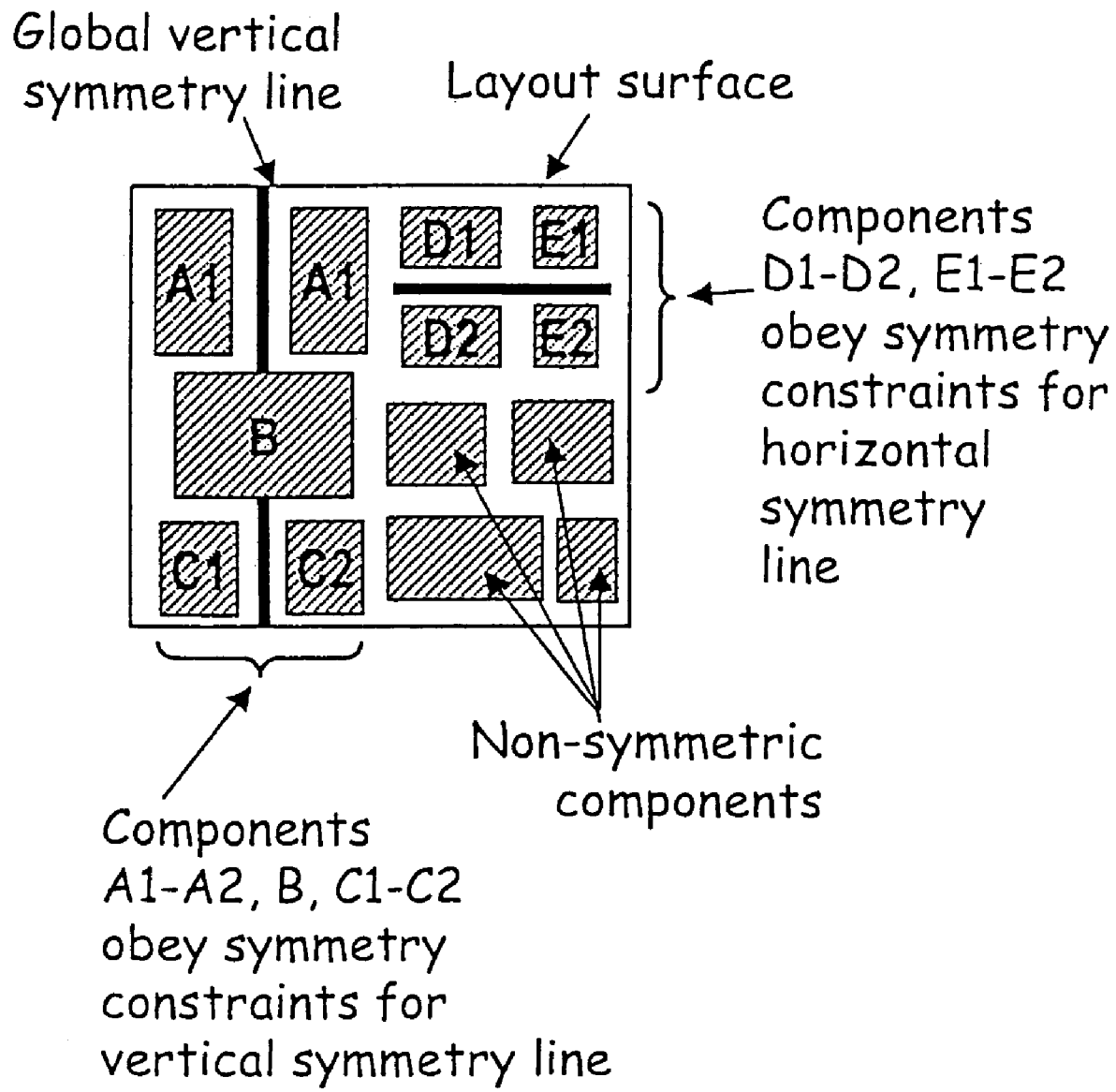
FIG. 15 shows a layout of components that includes a first subset of components laid out with respect to a vertical, global symmetry line that extends across the layout surface and a second subset of components laid out with respect to a local symmetry line that extends only partially across the layout surface.
Figure 16:
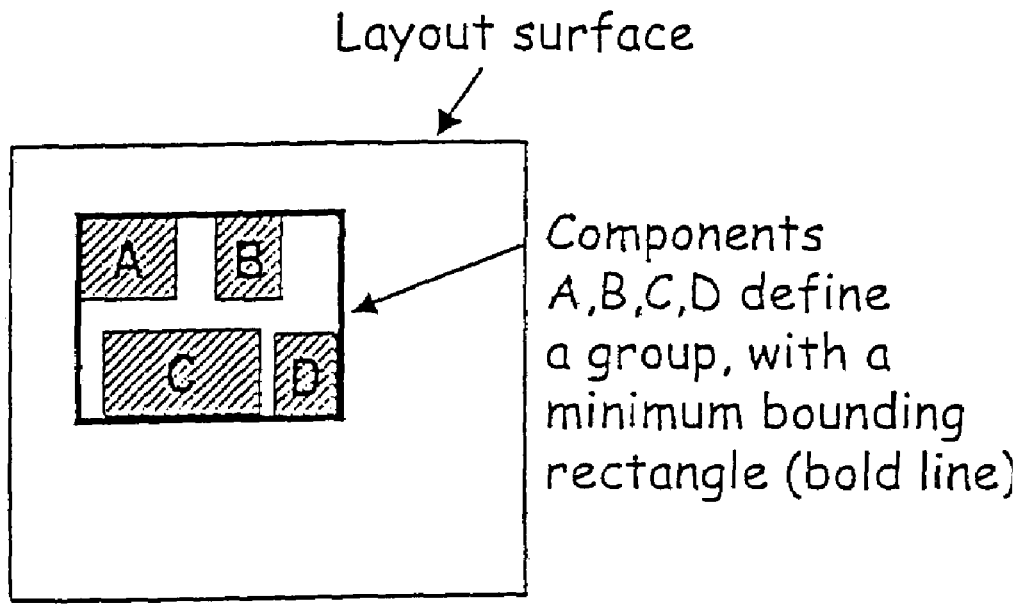
FIG. 16 shows components which define a group bounded by a minimum bounding rectangle.
Figure 17:
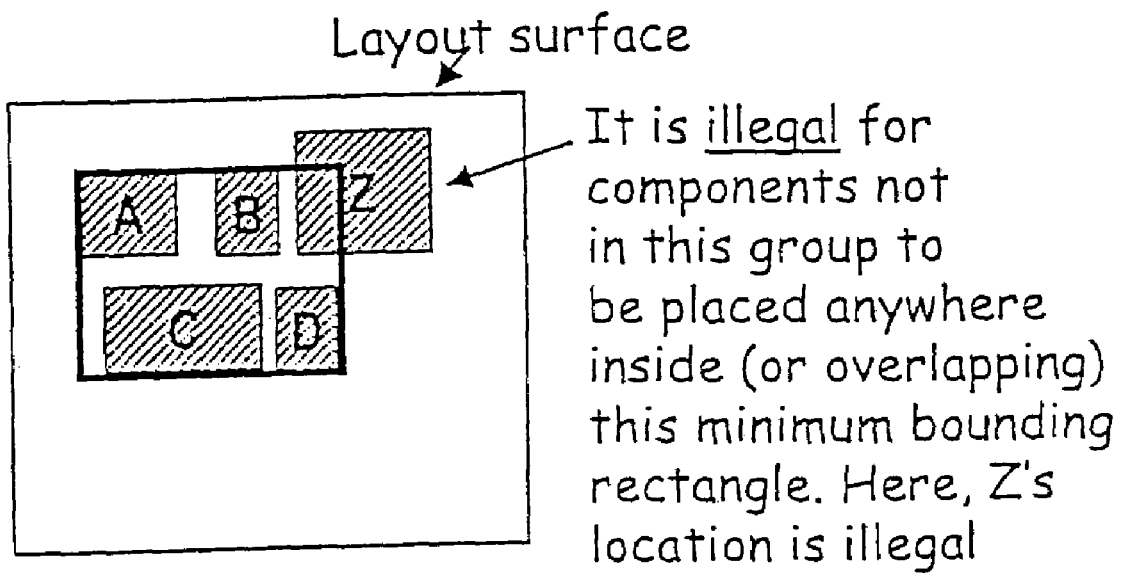
FIG. 17 shows an illegal placement of a component in the group shown in FIG. 16.
Figure 18:
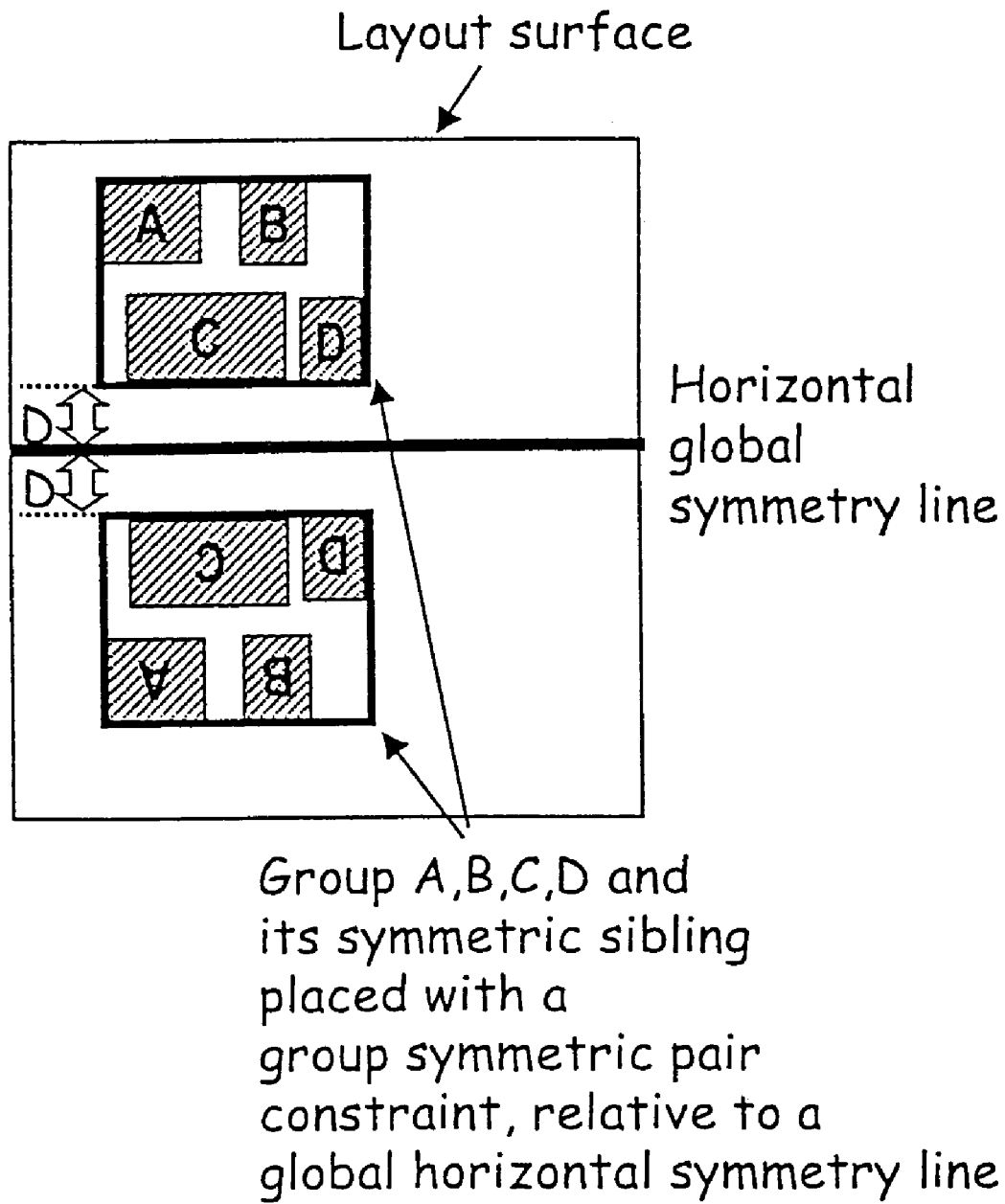
FIG. 18 shows a mirror image pair-symmetric placement of copies of the group shown in FIG. 16 on opposite sides of a horizontal global symmetry line.
Figure 19:
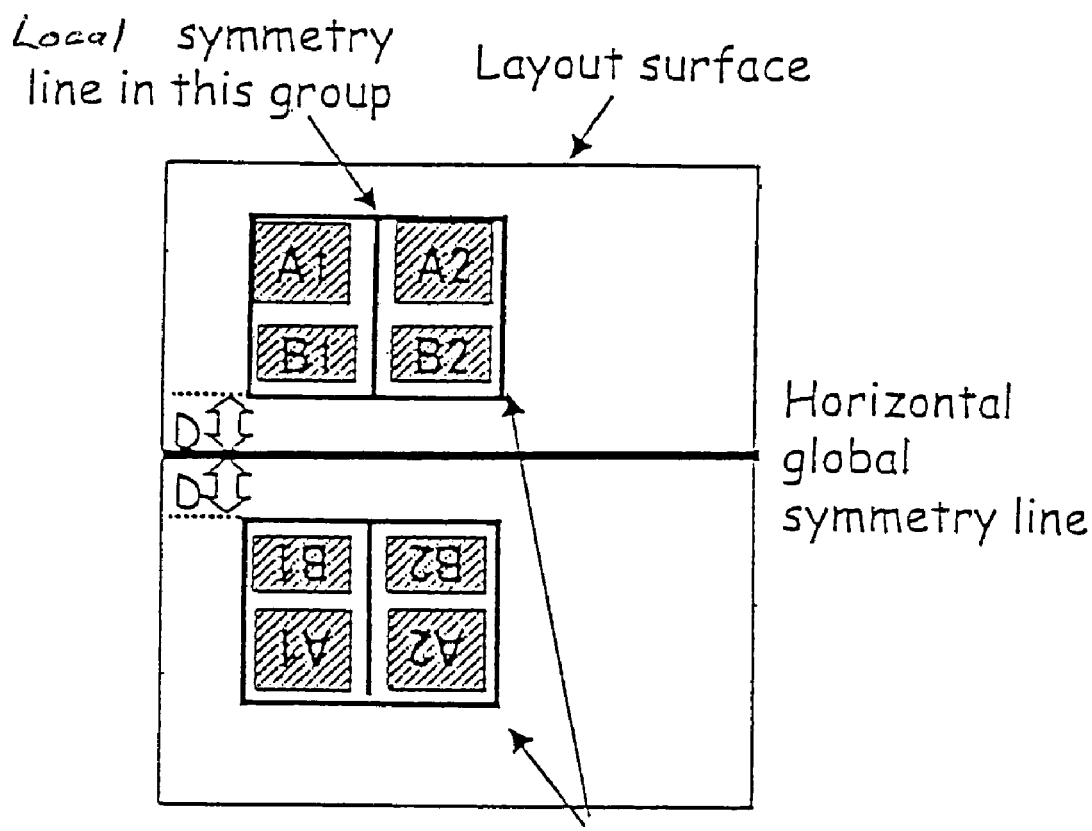
FIG. 19 shows a mirror image pair-symmetric placement of two groups on opposite sides of a horizontal global symmetry line, with each group including a vertical local symmetry line which is utilized for pair-symmetric placement of the components thereof.
Figure 20:
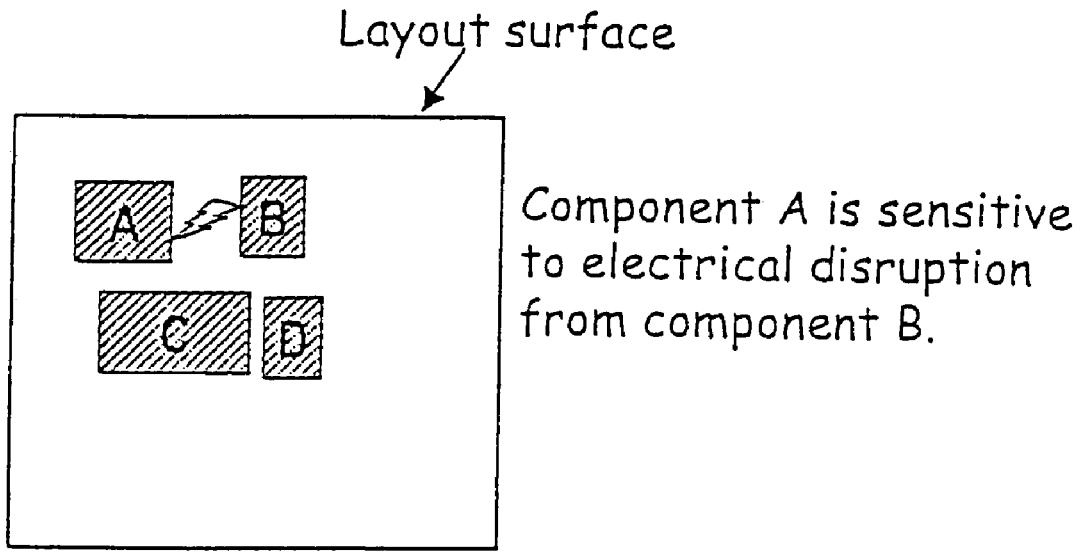
FIG. 20 shows a placement of components, where component A is sensitive to electric disruption from component B.
Figure 21:
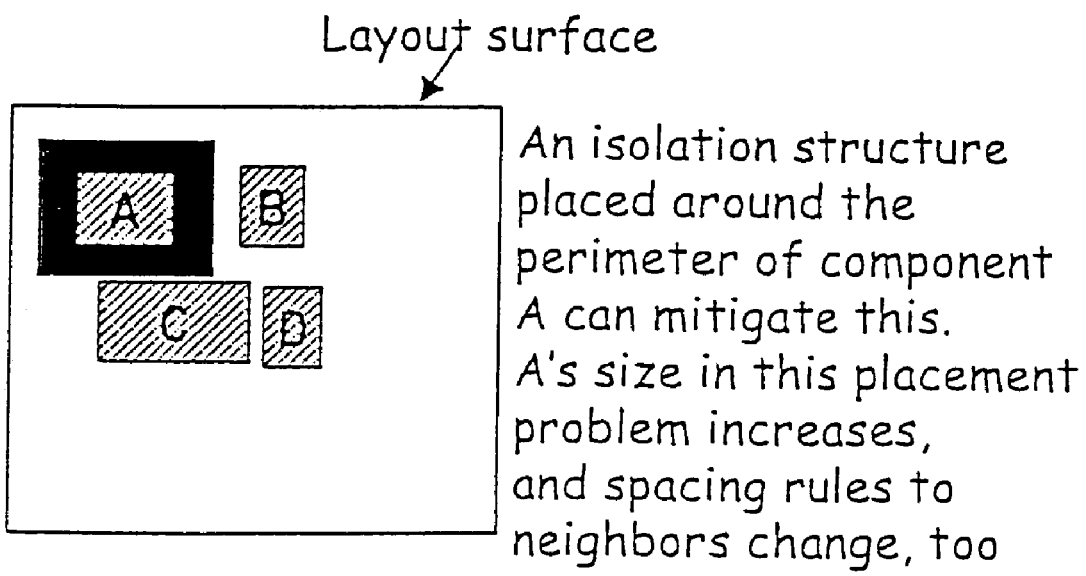
FIG. 21 shows the placement of components shown in FIG. 20 including an isolation structure around component A.
Figure 22:
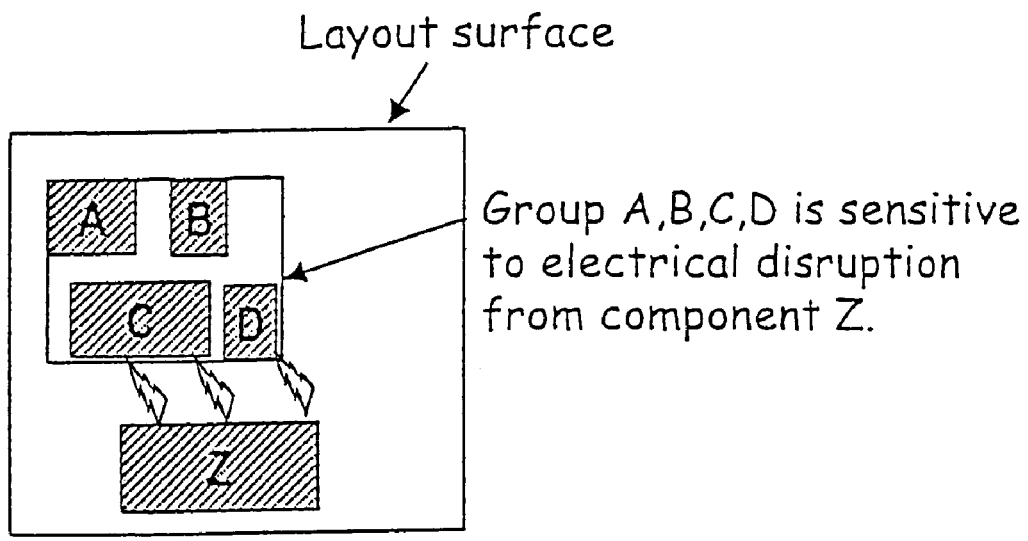
FIG. 22 shows a group and a component placed on a layout surface, where the group is sensitive to electrical disruption from the component.
Figure 23:
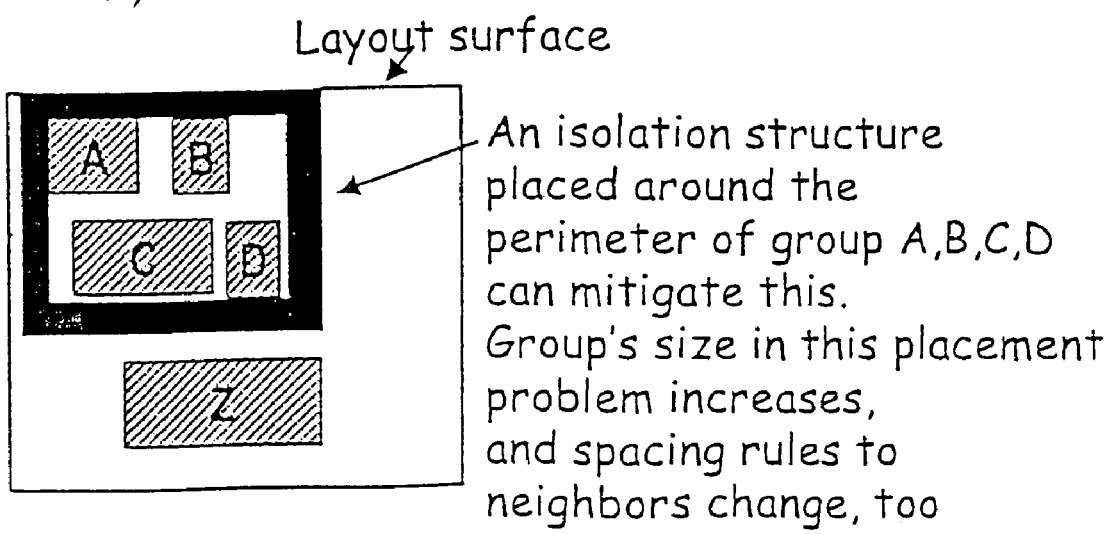
FIG. 23 shows the layout of the group and the component shown in FIG. 22 including an isolation structure around the perimeter of the group.
Figure 25:
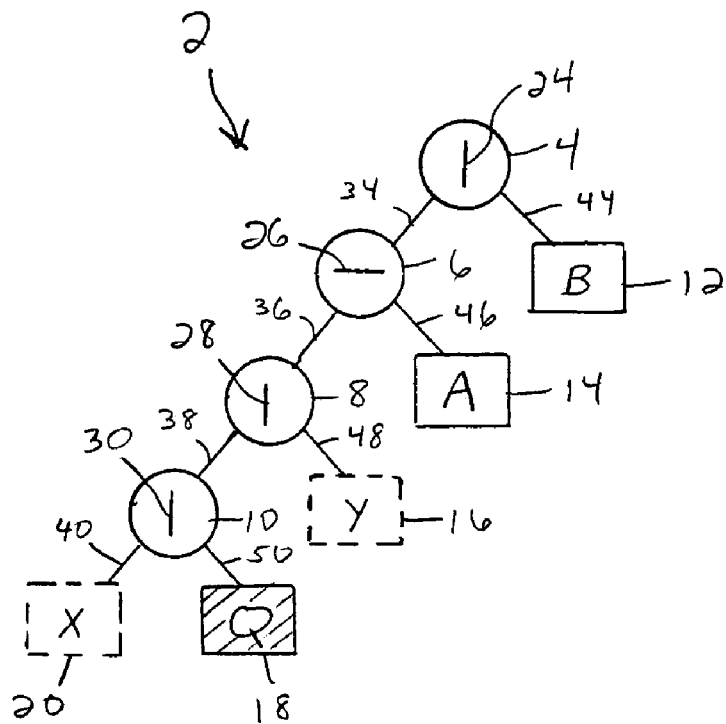
FIG. 25 is a tree structure formed from the components and placement constraints shown in FIG. 24.

With reference to FIG. 25 and with continuing reference to FIG. 24, once each component, its placement constraint and its size have been received, the computer readable program code causes the processor to create a tree structure 2 that includes a plurality of nodes 4–10 and a plurality of leaves 12–20. In tree structure 2, the plurality of nodes includes root node 4 and interior nodes 6, 8 and 10. The plurality of leaves includes leaf 12 associated with component B; leaf 14 associated with component A; leaf 16 associated with component Y; leaf 18 associated with component Q; and leaf 20 associated with component X.

With reference to FIG. 26 and with continuing reference to FIGS. 24 and 25, root node 4 represents a global symmetry line 24 that subdivides a layout surface 54 into a first side 56 and a second side 58. Each interior node 6, 8 and 10 represents a slicing line 26, 28 and 30, respectively, that prescribes the relative positions of the components connected thereto on first side 56, second side 58, or both sides 56 and 58 of layout surface 54. The placement of global symmetry line 24 and the use of slicing lines 26–30 for placement of components on one or both sides 56 and 58 of layout surface 54 will be described in greater detail hereinafter.

The component associated with each leaf 12–20 is tagged for placement on first side 56, second side 58, or on both sides 56 and 58 of global symmetry line 24, and, hence, layout surface 54. In FIG. 25, the solid boxes around components B and A of leaves 12 and 14, respectively, indicate that components B and A are tagged for placement on the left side of global symmetry line 24; the dashed boxes around components Y and X of leaves 16 and 20, respectively, indicate that components Y and X are tagged for placement on the right side of global symmetry line 24; the solid box including cross hatching extending from the lower left to the upper right around component Q of leaf 18 indicates that component Q is tagged for pair-symmetric placement on both sides of global symmetry line 24. Each node 4–10 has a first branch 34–40 descending from a first side thereof and a second branch 44–50, respectively, descending from a second side thereof.

Desirably, the computer readable program code causes the processor to randomly create tree structure 2 and to randomly tag each component designated for non-symmetric placement on the first side or the second side of global symmetry line 24. To this end, the direction, i.e., horizontal or vertical, of global symmetry line 24 or any slicing line 26, 28 or 30, is randomly selected. In practice, when tree structure 2 is initially created, it is desirable that each interior node be connected to (i) two other interior nodes, (ii) an interior node and a leaf, (iii) or two leaves in the next lower level of tree structure 2. However, this is not to be construed as limiting the invention. It is also desirable that interior nodes 6–10 extend in one direction from root node 4 to form therewith an edge of tree structure 2. However, this is not to be construed as limiting the invention.

With reference to FIG. 26 and with continuing reference to FIGS. 24 and 25, the use of tree structure 2 for placement of components A, B, Q, X and Y will now be described. Desirably, a structured search, for example, a depth-first search, is conducted of tree structure 2 to determine the initial placement of components. Specifically, starting at node 4, the search establishes global symmetry line 24 in a layout surface 54. Next, the search algorithm advances down the edge of tree structure 2, via first branches 34, 36 and 38, and interior nodes 6 and 8, until it reaches interior node 10 which has no interior nodes attached thereto deeper in tree structure 2. This first search of tree structure 2 can be utilized to initially place components on the left side, the right side, or simultaneously on the left and right sides of global symmetry line 24. For purpose of illustration, this first search of tree structure 2 will be described in connection with the placement of components on the left side of global symmetry line 24. However, this is not be construed as limiting the invention.

From interior node 10, the search algorithm advances to leaf 20 via first branch 40. Upon determining that component X associated with leaf 20 is tagged for placement on the right side of global symmetry line 24, the search algorithm backtracks to node 10 and advances to leaf 18 via second branch 50. Upon determining component Q associated with leaf 18 is tagged for pair-symmetric placement on both sides of global symmetry line 24, the search algorithm places a first instance of component Q on the left side of global symmetry line 24, with a right side 60 of this first instance of component Q adjacent global symmetry line 24, and with a left side 62 placed the width of component Q away from right side 60. In FIG. 26, the width of each component placed in layout surface 54 is perpendicular to global symmetry line 24 while the height of each component is parallel to global symmetry line 24. However, this is not be construed as limiting the invention since the height of each component can be positioned perpendicular to global symmetry line 24 and the width of each component can be positioned parallel to global symmetry line 24 if desired.

After placing the first instance of component Q, the search algorithm backtracks to interior node 8 and advances to leaf 16 via second branch 46. Upon discovering that component Y associated with leaf 16 is tagged for placement on the right side of global symmetry line 24, the search algorithm backtracks to interior node 6 and advances to leaf 14 via second branch 46.

Upon determining component A associated with leaf 14 is tagged for placement on the left side of global symmetry line 24, the search algorithm places component A on the left side of global symmetry line 24 relative to component Q based upon the orientation of slicing line 26 associated with interior node 6. More specifically, the horizontal orientation of slicing line 26 instructs the search algorithm that component A is to be placed above (or below) any component(s) placed thus far during this first search of tree structure 2.

The placement of component A above component Q in FIG. 26 can be based upon a rule that components connected to an interior node that represents a horizontal slicing line via the interior node's second branch are positioned above components connected to the interior node via its first branch. However, this is not to be construed as limiting the invention since this placement rule can be modified whereupon components connected to the interior node via its first branch are positioned above components connected to the interior node via its second branch. Alternatively, the decision to place component A above component Q, or vice versa, can be based upon the order of placement of component A and component Q by the search algorithm. For example, a rule can be established that components first placed by the search algorithm are placed below (or above) components that are placed thereafter. Desirably, however, once established, the rule for placement of components connected to a node having a horizontal slicing or symmetry line associated therewith is fixed.

Next, search algorithm backtracks to root node 4 and advances to leaf 12 via second branch 44. Upon determining that component B associated with leaf 12 is tagged for placement on the left side of global symmetry line 24, the search algorithm places component B on the left side of global symmetry line 24 on the sides of components A and Q opposite global symmetry line 24.

The decision to place component B on the sides of components A and Q opposite global symmetry line 24 can be based on a rule that components connected to root node 4 via its first branch 34 are positioned closer to global symmetry line 24 than components connected to root node 4 via its second branch 44. However, this is not to be construed as limiting the invention since this placement rule can be modified whereupon components connected to root node 4 via its second branch 44 are positioned closer to global symmetry line than components connected to root node 4 via its first branch 34. Alternatively, a rule can be established that components first placed by the search algorithm are placed closer to global symmetry line 24 than components placed thereafter, or vice versa. However, once established, the rule for placement of components connected to a node having a vertical slicing or symmetry line associated therewith is fixed.

Next, another structured search of tree structure 2 can be conducted to determine the placement of components on the right side of global symmetry line. Initially, the search algorithm advances down the edge of tree structure 2 until it reaches interior node 10. Next, the search algorithm advances to leaf 20 via first branch 40. Upon determining that component X associated with leaf 20 is tagged for placement on the right side of global symmetry line 24, the search algorithm places component X on the right side of global symmetry line 24. Next, the search algorithm backtracks to node 10 and advances to leaf 18 via second branch 50. Upon determining that component Q associated with leaf 18 is tagged for placement on both sides of global symmetry line 24, the search algorithm places a second instance of component Q (hereinafter Q') on the right side of global symmetry line 24 on a side of component X opposite global symmetry line 24.

Next, the search algorithm backtracks to node 8 and advances to leaf 16 via second branch 48. Upon determining that component Y associated with leaf 16 is tagged for placement on the right side of global symmetry line 24, the search algorithm places component Y on the right side of global symmetry line 24 on a side of component Q' opposite component X.

After placing component Y, the search algorithm backtracks to node 6 and advances to leaf 14 via second branch 46. Upon learning that component A associated with leaf 14 is tagged for placement on the left side of global symmetry line 24, the search algorithm backtracks to node 4 and advances to leaf 12 via second branch 44. Upon determining that component B associated with leaf 12 is designated for placement on the left side of global symmetry line 24, the search algorithm terminates the second search of tree structure 2.

In the foregoing description, first and second searches of tree structure 2 were performed to place components on the respective left and right sides of global symmetry line 24. However, as noted above, a single structured search of tree structure 2 can be performed to initially place components on both sides of global symmetry line 24. Hence, the foregoing description of two structured searches to place components on the left and right sides of global symmetry line 24 is not to be construed as limiting the invention.

With reference to FIG. 27 and with continuing reference to FIGS. 25 and 26, once the initial placement of components A, B, Q, Q', X and Y is complete, the final location of each component is determined by conducting another structured search of tree structure 2. Initially, the search algorithm advances along the edge of tree structure 2 until it reaches interior node 10. Next, the search algorithm advances to leaf 20 via first branch 40 where the search algorithm sets a left side 72 of component X adjacent global symmetry line 24 and a right side 74 of component X the width of component X away from left side 72. The distance between global symmetry line 24 and right side 76 of component X is stored in memory for subsequent use.

Next, the algorithm backtracks to interior node 10 and advances to leaf 18. Since component Q associated with leaf 18 is tagged for pair-symmetric placement, the search algorithm utilizes the position of right side 74 of component X to place a right side 60 of component Q and a left side 76 of component Q' the same distance from global symmetry line 24, with the left side 76 of component Q' adjacent right side 74 of component X. The algorithm then stores in memory for future use the distance that the left side 62 of component Q or the right side 78 of component Q' are from global symmetry line 24.

The algorithm then backtracks to interior node 6 and advances to leaf 14. Since component A has been placed above component Q previously, the algorithm can utilize the information stored in memory regarding the distance left side 62 or right side 78 of component Q or Q' is from global symmetry line 24 to place left side 66 of component A the same distance from global symmetry line 24. Since left side 66 and left side 62 of components A and Q, respectively, are in alignment the same distance from global symmetry line 24, it is not necessary to store in memory the distance between left side 66 and global symmetry line 24.

If, however, the width of component A were such that placement of the left side 62 of component Q and the left side 66 of component A in alignment resulted in component A overlapping global symmetry line 24, the search algorithm would place the right side 64 of component A adjacent global symmetry line 24 and the distance between left side 66 of component A and global symmetry line 24 would be stored in memory.

Next, the search algorithm backtracks to root node 4 and advances to leaf 12. Utilizing the greater of the distance left side 62 of component Q or left side 66 of component A is placed from global symmetry line 24, the search algorithm places right side 68 of component B adjacent left side 62 or left side 66 of components Q or A, respectively. Thereafter, since the final locations of components A, B, Q, Q', X and Y have been determined, the algorithm terminates horizontal placement of these components.

If desired, subject to maintaining the pair-symmetric placement of components Q and Q', components A, B, Q, Q', X and Y can be moved as necessary, either upwardly or downwardly parallel to global symmetry line 24, to minimize any vertical spacing therebetween. To this end, the topmost edge and bottommost edge of components A, B, Q, Q', X and Y can be utilized to establish top and bottom boundaries of layout surface 54 for the purpose of moving the components upwardly or downwardly. Similarly, left side 70 of component B and right side 90 of component Y can be utilized to establish the leftmost and rightmost boundaries of layout surface 54.

In the foregoing description, horizontal slicing line 26 and vertical slicing lines 28 and 30 were utilized to place components on opposite sides of global symmetry line 24. If however, global symmetry line 24 was oriented horizontally, the positions of components A, B, Q, Q', X and Y relative to each other and said horizontal global symmetry line can be determined from tree structure 2 simply by replacing each horizontal slicing line with a vertical slicing line and vice versa. Thereafter, one or more searches of the modified tree structure can be conducted in order to determine the initial placement of components on opposite sides of the horizontal global symmetry line and another search of the modified search tree can be conducted to determine the final placement of the components on opposite sides of the horizontal global symmetry line.

With reference to FIG. 28, suppose a tree structure 2*a* is formed by inserting an interior node 92 between interior nodes 8 and 10 of tree structure 2. In tree structure 2*a*, first branch 38 can connect interior node 92 to interior node 8 while a first branch 94 can connect interior node 92 to interior node 10. A second branch 96 can connect a leaf 98 to interior node 92. A component S, tagged for self-symmetric placement on both sides of global symmetry line 24, can be associated with leaf 98 and a horizontal slicing line 102 can be associated with interior node 92. In addition, suppose, horizontal slicing line 26 in tree structure 2 is replaced with vertical slicing line 26*a* in tree structure 2*a*. Other than the foregoing, tree structure 2*a* in FIG. 28 is the same as tree structure 2 in FIG. 25.

Figure 29:
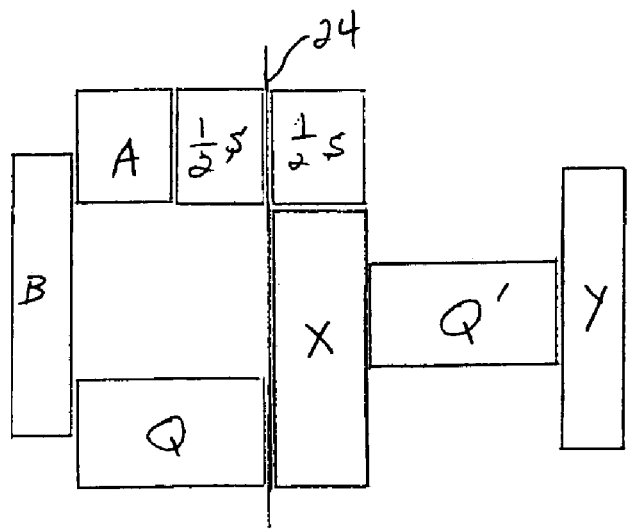
FIGS. 29 and 30 are respective initial and final layouts of the components of the tree structure in FIG. 28 determined from searches thereof.

With reference to FIG. 29 and with continuing reference to FIG. 28, the search algorithm can perform one or more structured searches of tree structure 2*a* to initially place components A, B, Q and ½S on the left side of global symmetry line 24 and to place components Q', ½S', X and Y on the right side of global symmetry line 24. More specifically, during the one or more searches of tree structure 2*a*, when the search algorithm determines component S associated with leaf 98 is tagged for self-symmetric placement, one-half of component S is initially placed on the left side of global symmetry line 24 and the other half of component S is initially placed on the right side of global symmetry line 20 in the manner described above in connection with tree structure 2. The remaining components of tree structure 2*a* are initially placed in the manner described above in connection with tree structure 2. The initial placement of the components of tree structure 2*a* is shown in FIG. 29.

Figure 30:
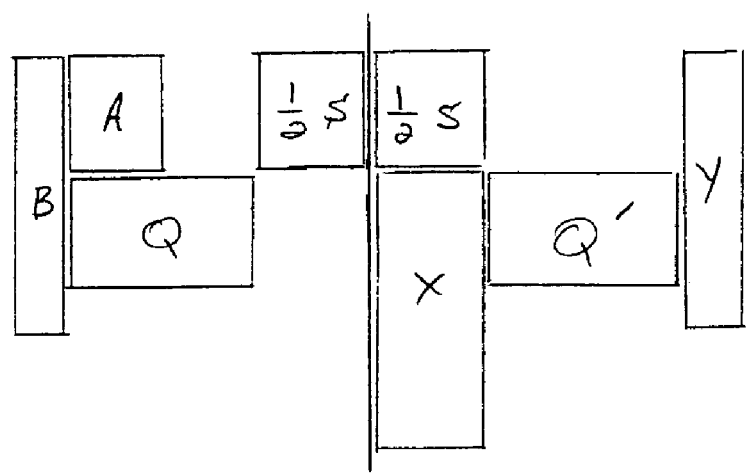

Once the initial placement of components is complete, another search of tree structure 2*a* is conducted to determine the final location of each component in FIG. 29. The final placement of the components of tree structure 2*a* is accomplished in the manner described above in connection with the final placement of components associated with tree structure 2. The final placement of the components of tree structure 2*a* is shown in FIG. 30.

Figure 31:
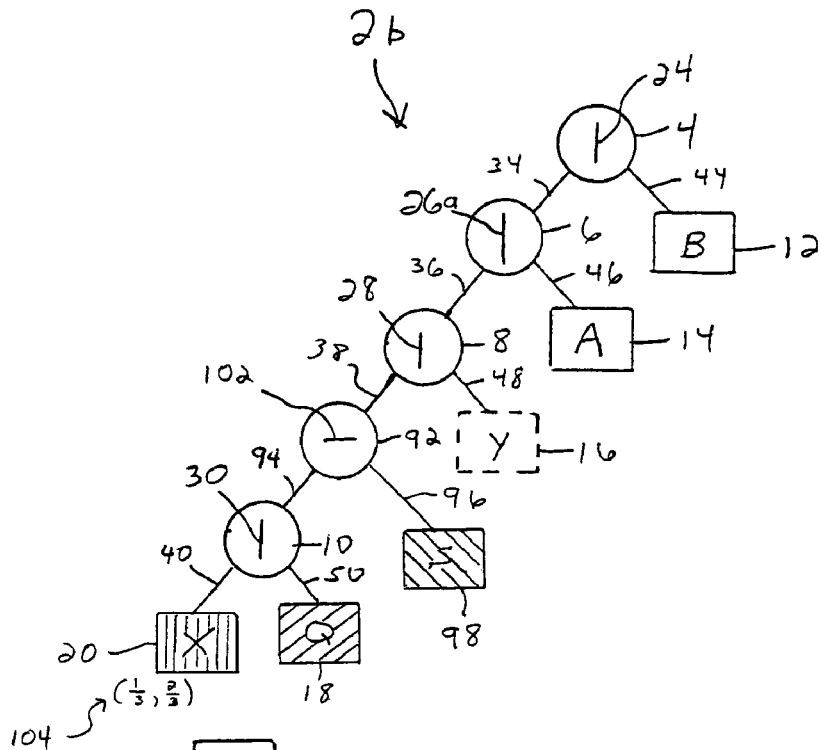
FIG. 31 is a variation of the tree structure shown in FIG. 28.

With reference to FIG. 31 and with continuing reference to FIG. 28, re-tagging component X from placement on the right of global symmetry line 24, as shown in FIG. 28 to placement asymmetrically on both sides of global symmetry line 24, as shown in FIG. 31, results in tree structure 2*a* being converted to tree structure 2*b*. The re-tagging of component X for asymmetric placement on both sides of global symmetry line 24 includes associating with component X data 104 that the search algorithm utilizes to determine what percentages of component X to place on both sides of global symmetry line 24 during the initial placement of component X. Specifically, as shown in FIG. 32, when the search algorithm determines that component X associated with leaf 20 is tagged for asymmetric placement on both sides of global symmetry line 24, the search algorithm utilizes data 104 to place one portion, e.g., ⅓, of component X on the left side of global symmetry line and to place the other portion, e.g., ⅔, of component X on the right side of global symmetry line 24.

The initial placement of the remaining components of tree structure 2*b* is then performed in the same manner as discussed above for the placement of components associated with tree structure 2. Once the initial placement of the components of tree structure 2*b* is complete, another search of tree structure 2*b* is performed to determine the final placement of the components of tree structure 2*b* shown in FIG. 33.

Figure 35:
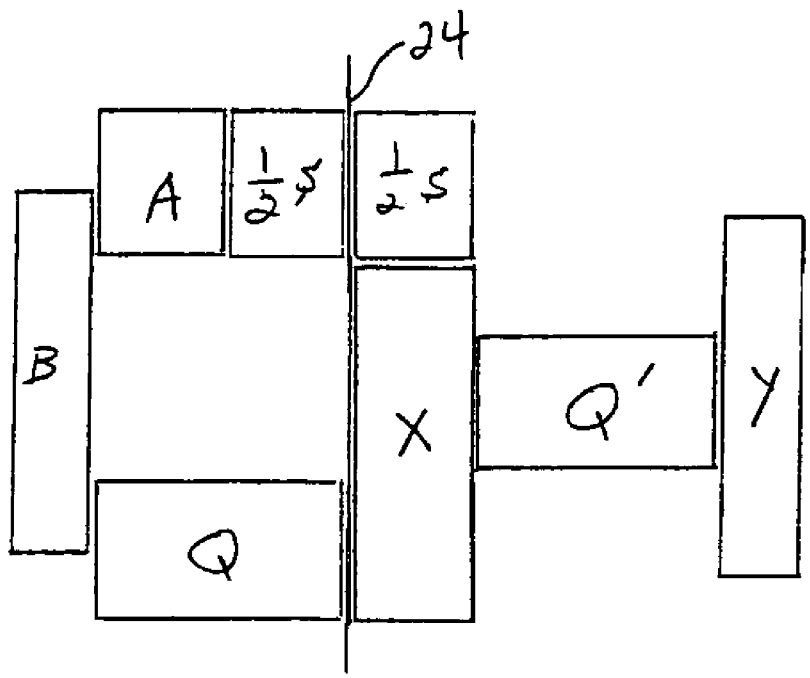
FIGS. 35 and 36 are respective initial and final layouts of the components of the tree structure of FIG. 34 determined from searches thereof.
Figure 36:
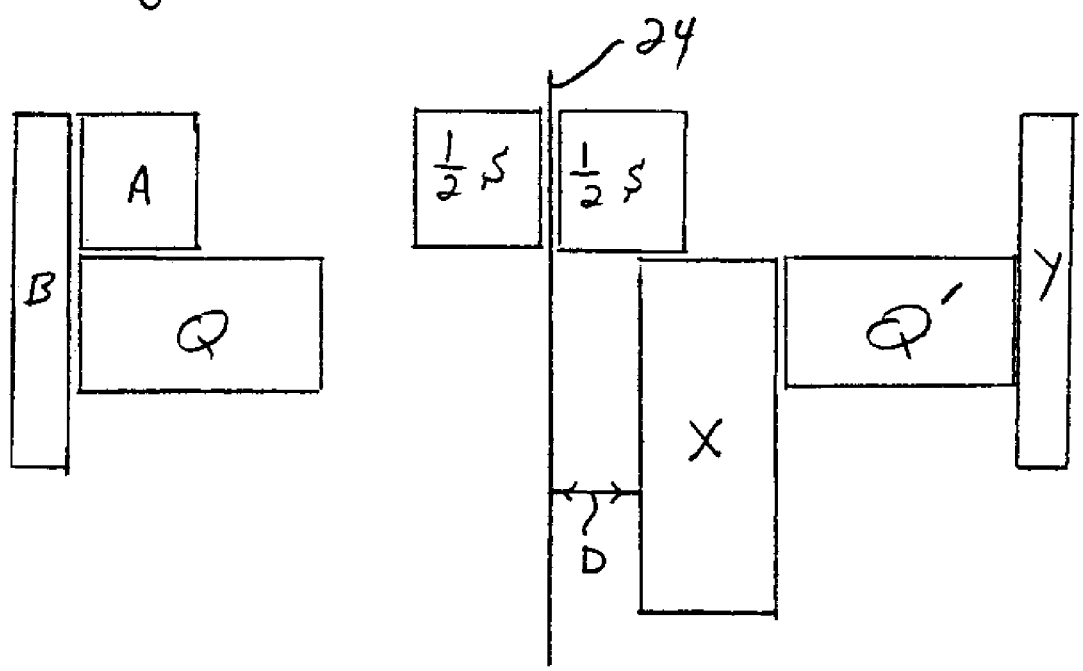

With reference to FIG. 34, re-tagging component X associated with leaf 20 in tree structure 2*b* from placement asymmetrically to placement a fixed symmetric offset on the right side of global symmetry line 24 changes tree structure 2*b* to tree structure 2*c* shown in FIG. 34. Performing one or more searches of tree structure 2*c* to initially place the components thereof results in the initial component placement shown in FIG. 35. Performing another search of tree structure 2*c* produces the final placement of the components thereof shown in FIG. 36. As shown in FIG. 34, component X associated with leaf 20 is tagged for placement on the right side of global symmetry line 24. In addition, component X has associated therewith data 106 which includes a distance D component X is to be placed from global symmetry line 24. Thus, when performing the final placement of the components of tree structure 2*c*, the search algorithm places the left side of component X distance D from global symmetry line 24. If component X were tagged for placement on the left side of global symmetry line 24, the search algorithm would place component X on the left side of global symmetry line 24, with the right side of component X distance D from global symmetry line 24.

Figure 37:
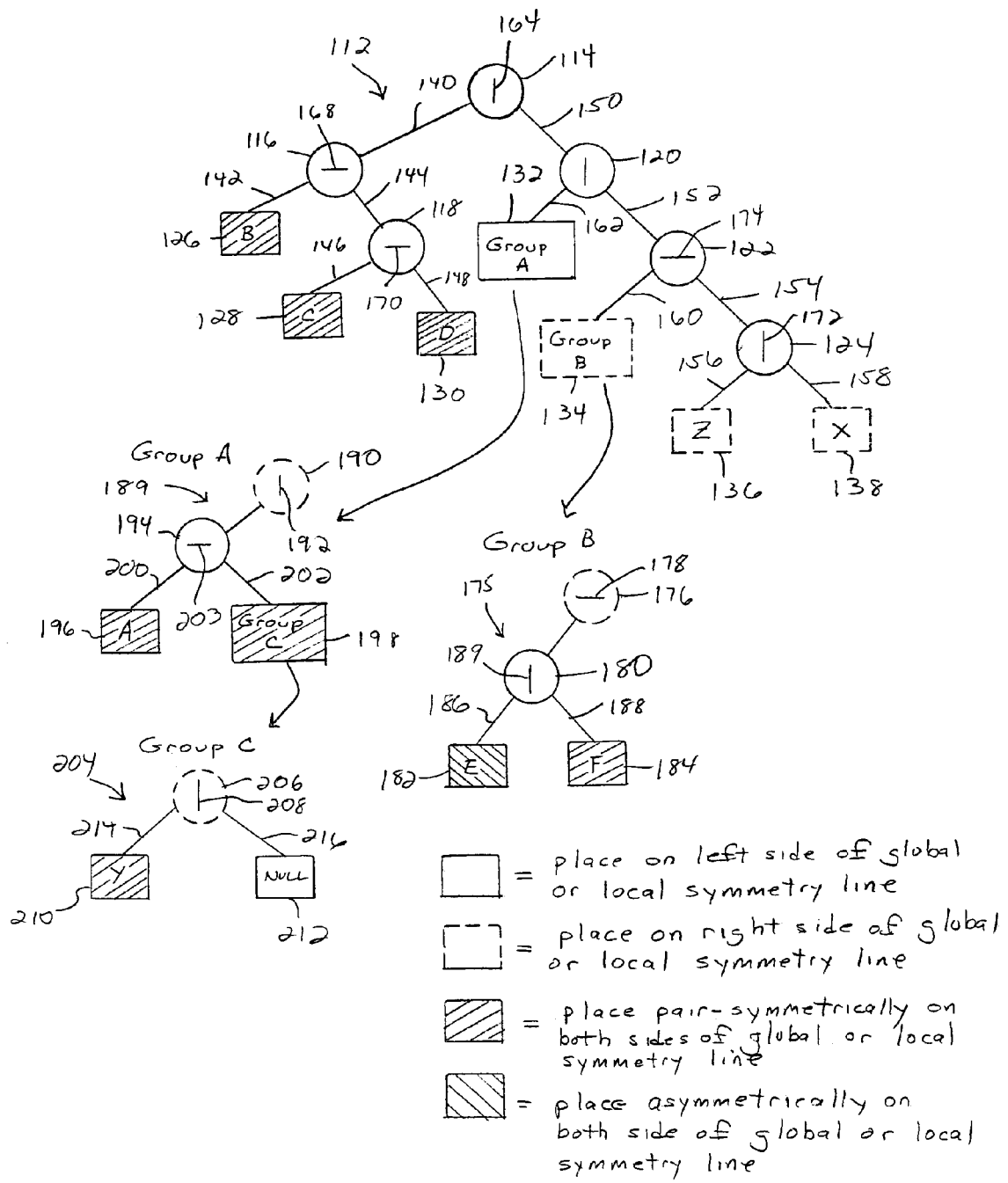
FIG. 37 is a tree structure having leaves that represent components and groups.

With reference to FIG. 37, additionally or alternatively, groupings of leaves and nodes can be placed on one or both sides of global symmetry line 24. To this end, one or more leaves, one or more local interior nodes and/or one or more local symmetry lines can be represented by a group which can be placed on one or both sides of global symmetry line 24 in the manner described above for components. For example, in FIG. 37, tree structure 112 includes root node 114, interior nodes 116–124, leaves 126–130, 136 and 138, and groups 132 and 134 connected in the illustrated manner.

In the foregoing description, two searches were performed of each search tree to determine the initial layout of components. However, as described above, a single search of the search tree can also be performed to determine the initial layout of components on both sides of global symmetry line 24. Hereinafter, the present invention will be described in connection with a performance of the single search of a search tree to determine the initial placement of components on either side of a symmetry line, either a global symmetry line or a local symmetry line.

Figure 38:
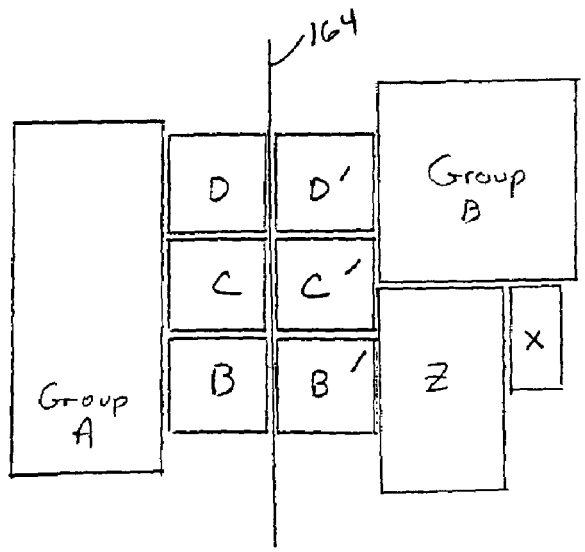
FIGS. 38 and 39 are respective initial and final layouts of the components and group of the tree structure of FIG. 37 determined from searches thereof.

With reference to FIG. 38 and with continuing reference to FIG. 37, utilizing tree structure 112, the search algorithm initially establishes a global symmetry line 164 associated with root node 114. Next, the search algorithm advances along the leftmost edge of tree structure 112 to interior node 116. Next, the search algorithm advances to leaf 126 associated with component B via first branch 142. In response to determining that component B is tagged for pair-symmetric placement, the search algorithm places copies B and B' of component B on the respective left and right sides of global symmetry line 164. Thereafter, the search algorithm backtracks to interior node 116 and advances to interior node 118 via second branch 144. At interior node 118, the search algorithm advances to leaf 126 associated with component C via a first branch 146. Upon determining that component C is tagged for pair-symmetric placement, the search algorithm places copies C and C' of component C on the respective left and right sides of global symmetry line 164. Since copies C and C' of component C have already been placed, the search algorithm places copies C and C' above copies B and B'. However, this is not be construed as limiting the invention since other placement rules can be utilized.

Next, the search algorithm backtracks to interior node 118 and advances to leaf 130 associated with component D via second branch 148. Upon determining that component D is tagged for pair-symmetric placement, the search algorithm places copies D and D' of component D on the left and right sides of global symmetry line 164 above copies C and C', respectively.

Next, since the first and second branches of interior nodes 116 and 118 have already been searched, the search algorithm backtracks to root node 114. From there, the search algorithm advances down the rightmost edge of tree structure 112 to interior node 124. From there, the search algorithm advances to leaf 136 corresponding to component Z via first branch 156. Upon determining that component Z is tagged for placement on the right side of global symmetry line 164, the search algorithm places component Z to the right of components B', C' and D'.

Next, the search algorithm backtracks to node 124 and advances to leaf 138 corresponding to component X via second branch 158. Since component X is tagged for placement on the right side of global symmetry line 164 and since interior node 124 has vertical symmetry line 172 associated therewith, component X is placed on a side of component Z opposite global symmetry line 164.

Figure 39:
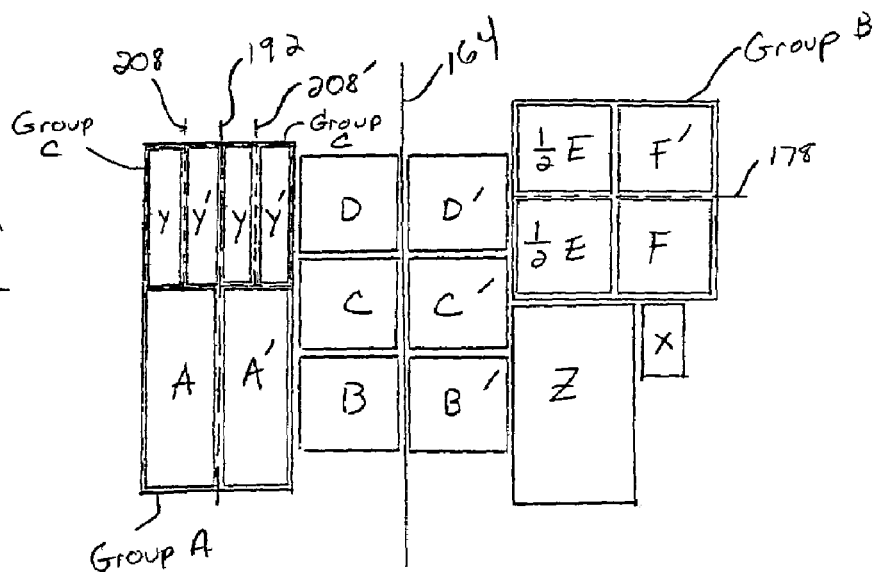

With reference to FIG. 39 and with continuing reference to FIGS. 37 and 38, next, the search algorithm backtracks to interior node 122 associated with horizontal symmetry line 174. From interior node 122, the search algorithm advances to leaf 134 representing a group B via first branch 160. Upon determining that group B is tagged for placement on the right side of global symmetry line 164, the search algorithm places a rectangle representing group B, or the component(s) and any local symmetry line(s) associated with group B, above components Z and X. The placement of the rectangle representing group B above components Z and X can be based upon the order of placement of components Z and X and group B or the connection of group B to interior node 122 via first branch 160 and the connection of leaves 136 and 138 representing components Z and X, respectively, to interior node 122 via second branch 154. As shown in FIG. 37, group B includes a local tree structure 175 having a local root node 176 that represents a local, horizontal symmetry line 178, an interior node 180 and leaves 182 and 184 representing components E and F, respectively.

At a suitable time, the search algorithm performs a search of local tree structure 175 to determine the placement of components E and F in the rectangle representing group B. More specifically, commencing at local root node 176, the search algorithm establishes local, horizontal symmetry line 178. Thereafter, the search algorithm advances via interior node 180 and first branch 186 to leaf 182. Upon determining that component E associated with leaf 182 is tagged for asymmetric placement on both sides of local, horizontal symmetry line 178, the search algorithm places one-half of component E below horizontal symmetry line 178 and the other half of component E above horizontal symmetry line 178. Thereafter, the search algorithm backtracks to node 180 and advances to leaf 184 via second branch 188. Upon determining that component F is tagged for pair-symmetric placement on both sides of local, horizontal symmetry line 178, the search algorithm places copies F and F' of component F above and below local, horizontal symmetry line 178 on the side of component E opposite global symmetry line 164. The decision to place copies F and F' of component F to the right of component E can be based on a rule for placement of components connected to an interior node, e.g., local interior node 180, representing a vertical, local symmetry line 189 whereupon later placed components are placed further away from global symmetry line 164 than earlier placed components. However, this is not to be construed as limiting the invention.

After the search algorithm places a rectangle representing group B, or the component(s) and any local symmetry line(s) associated with group B, above components Z and X, the search algorithm backtracks from leaf 134 to interior node 120 via interior node 122 and second branch 152. From interior node 120, the search algorithm advances to leaf 132. Upon determining that group A associated with leaf 132 is tagged for placement on the left side global symmetry line 164, the search algorithm places a rectangle representing group A, or the component(s) and any local symmetry line(s) associated with group A, on a side of components B, C and D opposite global symmetry line 164. As shown in FIG. 37, group A includes a local tree structure 189 having a local root node 190 that represents a local, horizontal symmetry line 192, an interior node 194 and leaves 196 and 198 representing a component A and a group C, respectively.

At a suitable time, the search algorithm performs a search of local tree structure 189 to determine the placement of components associated therewith in the rectangle representing group A. Specifically, commencing with local root node 190, the search algorithm initially places a local, vertical symmetry line 192 on a side of components B, C and D opposite global symmetry line 164 as shown in FIG. 39. Thereafter, the search algorithm advances to leaf 196 associated with component A via interior node 194 and first branch 200. Upon determining that component A is tagged for pair-symmetric placement on both sides of local, vertical symmetry line 192, the search algorithm places copies A and A' of component A on the respective left and right sides of local, vertical symmetry line 192.

Thereafter, the search algorithm backtracks to interior node 194 and advances to leaf 198 via second branch 202. Upon determining that group C associated with leaf 198 is tagged for pair-symmetric placement on both sides of local, vertical symmetry line 192, the search algorithm places copies of the rectangle representing group C on the left and right sides of local symmetry line 192 above copies A and A' of component A based on a rule for placement of components connected to a local, horizontal interior node, e.g., local interior node 194, representing a horizontal local symmetry line 203.

As shown in FIG. 37, group C includes local tree structure 204 having a local root node 206 that represents a local, vertical symmetry line 208, a leaf 210 representing a component Y and a leaf 212 representing a null. In practice, it is not necessary to include leaf 212 and second branch 216 connected thereto in local tree structure 204. However, second branch 216 and leaf 212 are included in group C shown in FIG. 37 for the purpose of illustration. At a suitable time, the search algorithm performs a search of local tree structure 204 associated with group C. Starting at local root node 206, the search algorithm places copies 208 and 208' of local, vertical symmetry line 208 on the left and right sides of local symmetry line 192. Thereafter, the search algorithm advances to leaf 210 via first branch 214. Upon determining that component Y associated with leaf branch 210 is tagged for pair-symmetric placement on both sides of local symmetry line 208, the search algorithm places first copies Y and Y' of component Y on the left and right sides of local symmetry line 208 and places second copies Y and Y' of component Y on the left and right sides of local symmetry line 208'.

After the search algorithm places copies of the rectangle representing group C on the left and right sides of local symmetry line 92, or places copies of each component and each symmetry line associated with each copy of group C on the left and right sides of local symmetry line 192, the search algorithm backtracks to root node 114 via interior node 120 and second branch 150 and terminates the initial placement of the components associated with tree structure 112.

Once the initial placement of components associated with tree structure 112 is complete, another search of tree structure 112 can be performed in the manner discussed above in connection with tree structures 2, 2a, 2b and 2c, to determine the final placement of the components associated with tree structure 112 shown in FIG. 39.

In the foregoing description, the placement of each component with respect to a global or local symmetry line was based on the width of the component for a vertical symmetry line or the height of the component for a horizontal symmetry line. It is often, however, desirable to place an isolation structure on one or more sides of an object or a group in order to isolate it from outside disruptive sources, such as an electrical source, a thermal source, and the like, or to provide additional space to account for variances in manufacturing tolerances. To this end, the component or group associated with each leaf requiring an isolation structure can have associated therewith isolation data (not shown) that the search algorithm can utilize to increase the size of the component or the group to provide the necessary isolation structure on one or more sides thereof. For example, the isolation data can cause the search algorithm to include an isolation structure on the left side, right side, topside and/or bottom side of a component or group as desired. In a similar manner, an isolation structure can be associated with the global root node, a local root node, and/or an internal node. For nodes having isolation data associated therewith, the size associated with each component connected to the node via its branches will be augmented by the isolation structure on one or more sides thereof.

Figure 40A:
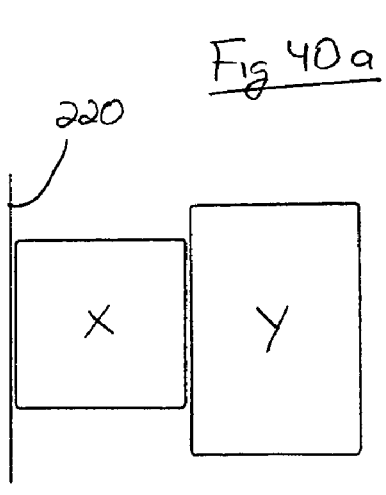
FIG. 40a shows the placements of components X and Y relative to a vertical symmetry line in the absence of an isolation structure.
Figure 40B:
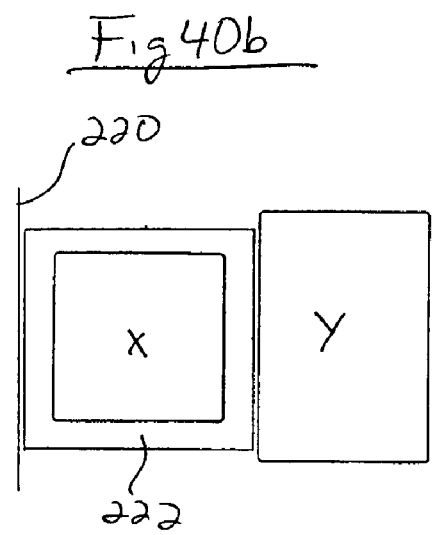
FIG. 40b shows the placements of components X and Y relative to the vertical symmetry line in the presence of an isolation structure around component X.

With reference to FIGS. 40a and 40b, once a component has been augmented with an isolation structure, the periphery of the isolation structure is utilized in place of the periphery of the component for purposes for placement of the component. For example, FIG. 40a shows the placement of a component X with its left edge adjacent a symmetry line 220 and with its right edge adjacent the left edge of a component Y. If, during placement of component X, the search algorithm determines that component X has isolation data associated therewith, the search algorithm adds isolation structure 222 around component X during placement and uses the periphery of isolation structure 222 in place of the periphery of component X for purposes of placement. Thus, after placement, the left and right edges of isolation structure 222 are positioned adjacent symmetry line 220 and the left edge of component Y, respectively. Thus, as can be seen, the left side of isolation structure 222 increases the distance between the left edge of component X and symmetry line 220 while the right side of isolation structure 222 increases the distance between the right edge of component X and the left edge of component Y.

Figure 41:
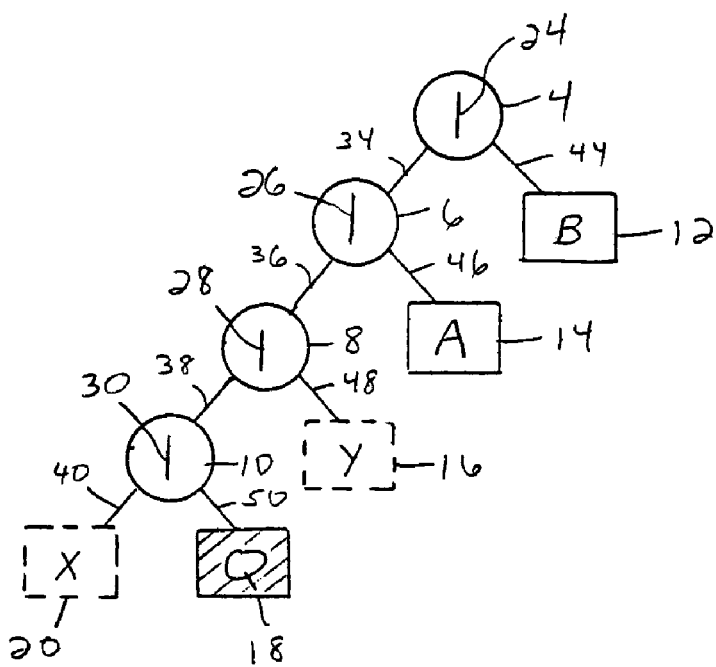
FIG. 41 shows a variation of the tree structure shown in FIG. 25.
Figure 42:
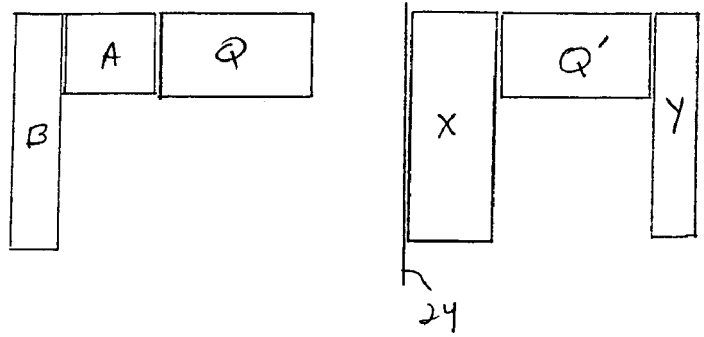
FIG. 42 shows the final placement of the components of the tree structure shown in FIG. 41 determined from searches thereof.

The searches of a tree structure described above may not necessarily result in the most efficient placement of components. In order to automatically generate a new placement of components, the tree structure that resulted in the original placement of components can be amended or perturbed and searches of the thus perturbed tree structure can be performed to determine a new layout of components. For example, FIG. 27 shows the final layout of components A, B, Q, Q', X and Y resulting from tree structure 2 shown in FIG. 25. One perturbation of tree structure 2 can include changing the direction slicing line 26 from horizontal in FIG. 25 to vertical in the tree structure shown in FIG. 41. The final layout resulting from this change is shown in FIG. 42.

Figure 44:
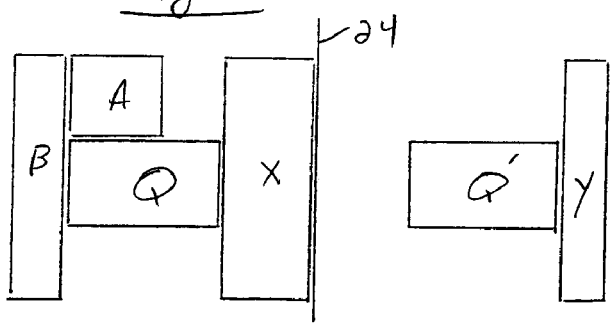
FIG. 44 shows the final placement of the components of the tree structure shown in FIG. 43 determined from searches thereof.
Figure 43:
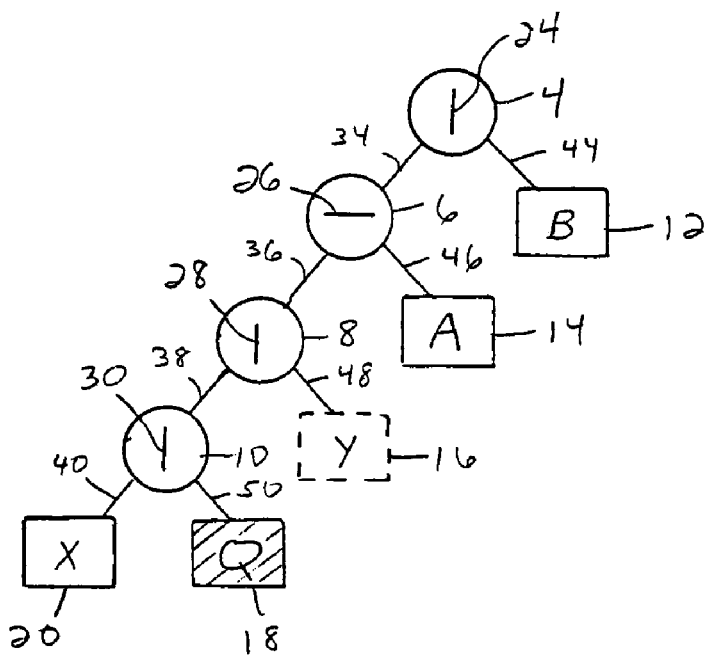
FIG. 43 shows another variation of the tree structure shown in FIG. 25.

Another perturbation can include changing a component tagging whereupon the component placement changes from one side of a symmetry line to the other side of the symmetry line. For example, in FIG. 25, component X is tagged for placement on the right side of global symmetry line 24. If tree structure 2 is perturbed by tagging component X for placement on the left side of global symmetry line, as shown in FIG. 43, the final layout of components shown in FIG. 44 results from the searches of the tree structure shown in FIG. 43.

Figure 46:
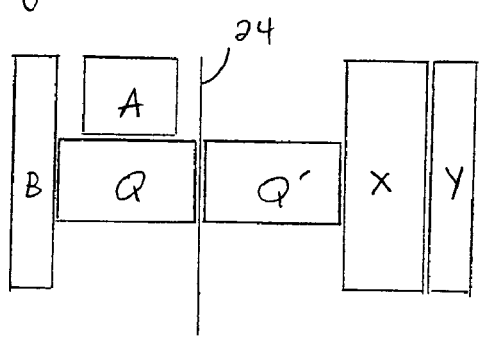
FIG. 46 shows the final placements of the components of the tree structure shown in FIG. 45 determined from searches thereof.
Figure 45:
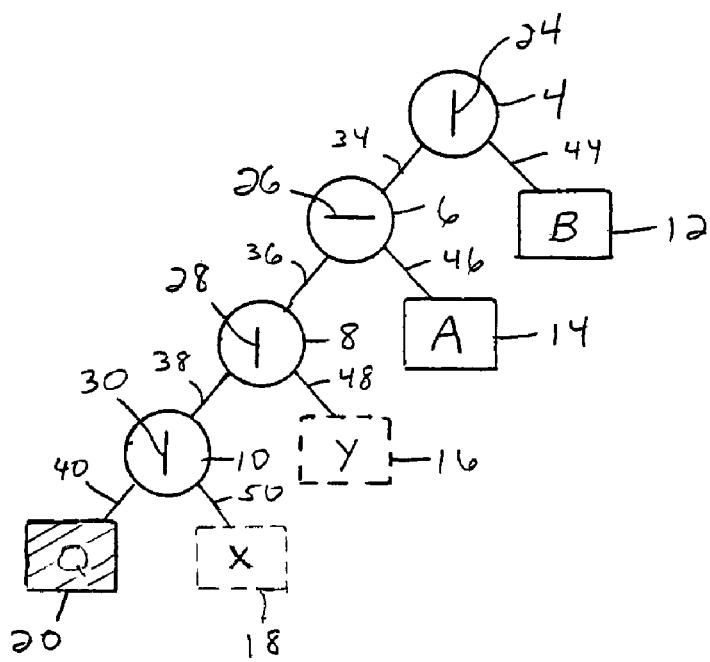
FIG. 45 shows another variation of the tree structure shown in FIG. 25.

Another perturbation of tree structure 2 in FIG. 25 can include swapping components, e.g., components Q and X to produce the tree structure shown in FIG. 45. After this swap, component Q tagged for pair-symmetric placement on both sides of global symmetry line 24 is associated with leaf 20 and component X tagged for placement on the right side of global symmetry line 24 is associated with leaf 18. The final placement of components resulting from the tree structure shown in FIG. 45 is shown in FIG. 46.

Figure 48:
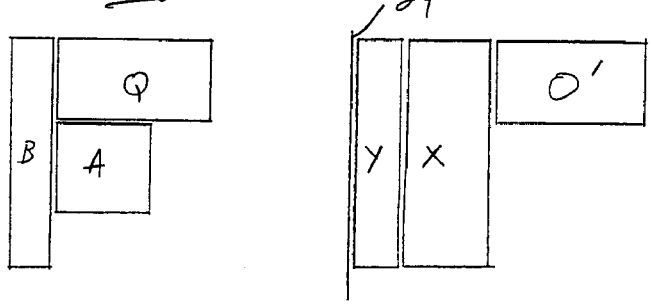
FIG. 48 shows the final placement of the components of the tree structure shown in FIG. 47 determined from searches thereof.

Another example of a tree perturbation includes swapping a node and a leaf. For example, swapping interior node 10 and leaf 14 in FIG. 25 results in the tree structure shown in FIG. 47. The final placement of components resulting from searches of the tree structure shown in FIG. 47 is shown in FIG. 48.

As can be seen from a comparison of the final layout shown in FIG. 27 to the final layout shown in each of FIGS. 42, 44, 46 and 48, a simple perturbation of the tree structure shown in FIG. 25 produces dramatic changes in the layout of the components associated therewith. The four simple perturbations discussed above in connection with FIGS. 41–48 can be used either singly or in combination as desired to produce even more changes in the final layout of components. Another simple perturbation includes exchanging the width and the height of each of one or more components.

Moreover, the search algorithm can perform a plurality of tree perturbations, either stochastically and/or heuristically, in order to generate a plurality of different final layouts. More specifically, starting from an initial tree structure, the search algorithm can stochastically or heuristically perturb the original tree structure and then determine therefrom the final layout of components therefor. The search algorithm can then perturb the new tree structure to obtain another new tree structure from which the search algorithm can generate another final layout of components. This process can continue until a desired number of new tree structures and their associated final layouts have been produced.

The perturbation of tree structures can occur sequentially, that is, with each new tree structure being derived from the immediately preceding tree structure. However, the search algorithm can be configured to return to a tree structure in the sequence other than the immediately preceding tree structure. Upon returning to this tree structure in the sequence, the search algorithm can perturb the tree structure in a manner differently than the previous perturbation thereof in order to generate another new tree structure that heretofore was not previously generated. From this newly generated tree structure, other new tree structures can then be generated. In this manner, the number of tree structures produced from an original tree structure can be greatly enlarged.

A "cost" can be determined for the final layout associated with each tree structure. This "cost" is a numerical value that quantifies the desirability or favorability of the corresponding final layout. The "cost" of each final layout can be determined in any suitable manner. One manner of determining the "cost" of a final layout includes forming a ratio of the total area of the components and, if provided, any isolation structures over the total area of a rectangle that bounds the components, and any isolation structures, associated with the final layout. As would be apparent to one of ordinary skill in the art, a cost determined in this manner having a value closer to 1 means that the components forming the final layout take up more space of the bounding rectangle than a final layout having a cost further away from the value 1.

Once a cost has been determined for the final layout associated with each tree structure, the layout having the most favorable cost associated therewith can be selected for implementation.

As can be seen, the present invention utilizes a tree structure configured to support all of the constraints necessary for placement of components and/or groups. The tree structure can be easily perturbed to generate new tree structures wherefrom new layouts that satisfy all the placement constraints can be generated. A cost associated with each layout can then be utilized to select an optimal layout for implementation.

The invention has been described with reference to the preferred embodiments. Obvious modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A computer-implemented method for determining component placement in a circuit comprising:
   (a) receiving a plurality of components, with each component having associated therewith a width, a height and one of a symmetric and a non-symmetric placement constraint;
   (b) creating a tree structure according to a global symmetry line that expresses the placement constraints for the plurality of components, the tree structure including:
      a global root node that represents the global symmetry line,
      a leaf representing each component, with each component associated with a leaf tagged for placement on a first side, a second side, or on both sides of the global symmetry line, and
      at least one interior node that represents a slicing line that establishes a relative placement of at least two components with respect to each other on the same side of the global symmetry line;
   (c) performing at least one structured search of the tree structure to determine the initial placement of components on the first side, the second side or both sides of the global symmetry line based on the tagging of each component and the connections of the leaves, the global root node and the interior nodes to form the tree structures; and
   (d) performing another structured search of the tree structure to determine the final placement of components based on at least one of the widths and heights of the components.

2. The method of claim 1, wherein each structured search is a depth-first search.

3. The method of claim 1, wherein:
   each slicing line has a direction that is one of parallel and perpendicular to the global symmetry line; and
   step (c) includes the placement of said at least two components with respect to each other as a function of the direction of the slicing line.

4. The method of claim 1, wherein step (c) includes, for components tagged for placement on the same side of the global symmetry line, further comprises:
   determining a first component associated with a leaf is positioned lower in the tree structure than a second component associated with a leaf; and
   placing the first component closer to the global symmetry line than the second component.

5. The method of claim 1, wherein:
   each node has a pair of branches descending therefrom; and
   each branch couples the node from which it descends to (1) one of the interior nodes, (2) one of the leaves, or (3) a null.

6. The method of claim 5, wherein step (c) includes, for an interior node that represents a slicing line that is parallel to the global symmetry line:
   placing on one side of the global symmetry line, a first component which is tagged for such placement and which is represented by a leaf which is connected to said interior node via one of its branches; and
   placing on a side of the first component opposite the global symmetry line a second component which is tagged for placement on the one side of the global symmetry line and which is represented by a leaf which is connected to said interior node via the other of its branches.

7. The method of claim 6, wherein at least one of the leaves representing the first and the second components is connected directly to said interior node.

8. The method of claim 5, wherein step (c) includes, for the global root node:
   placing a first component which is tagged for placement on one side of the global symmetry line and which is represented by a leaf which is connected to said global root node via one of its branches; and
   placing on a side of the first component opposite the global symmetry line, a second component which is tagged for placement on the one side of the global symmetry line and which is represented by a leaf which is connected to said global root node via the other of its branches.

9. The method of claim 8, wherein at least one of the leaves representing the first and second components is connected directly to said global root node.

10. The method of claim 5, wherein step (c) includes, for an interior node that represents a slicing line that is perpendicular to the global symmetry line:
   placing on one side of the global symmetry line, a first component which is tagged for such placement and which is represented by a leaf which is connected to said interior node via one branch descending therefrom; and
   placing one of above and below the first component, a second component which is tagged for placement on the one side of the global symmetry line and which is represented by a leaf which is connected to said interior node via the other branch descending therefrom.

11. The method of claim 5, wherein step (d) includes placing one edge of a component adjacent the global symmetry line when the leaf representing said component is one of:
  connected to a node at the lowest level of the tree structure via one branch descending from said node; or
  connected to said node via the other branch descending therefrom and no other leaf is connected to said interior node via the one branch descending therefrom.

12. The method of claim 5, wherein, for each component tagged for placement on both sides of the global symmetry line in a pair-symmetric manner, step (c) includes placing first and second copies of said component on the respective first and second sides of the global symmetry line, with each copy of the component having a side closest to the global symmetry line positioned a distance D therefrom.

13. The method of claim 12, wherein the distance D is one of:
  zero when the leaf representing the component tagged for pair-symmetric placement is connected directly to a node at the lowest level of the tree structure; or
  the greater of (1) a sum of the width(s) or height(s) of each component placed on the first side of the global symmetry line prior to placement of copies of the component tagged for pair-symmetric placement or (2) a sum of the width(s) or height(s) of each component placed on the second side of the global symmetry line prior to placement of copies of the component tagged for pair-symmetric placement.

14. The method of claim 1, wherein, for each component tagged for placement on both sides of the global symmetry line in a self-symmetric or asymmetric manner, step (c) includes placing a first part of said component on the first side of the global symmetry line and placing a second part of said component on the second side of the global symmetry line.

15. The method of claim 14, wherein:
  for each component tagged for self-symmetric placement, the first part of the component is one-half of the component and the second part of the component is the other half of the component; and
  for each component tagged for asymmetric placement, the first part of the component is a first percentage of said component, the second part of the component is a second percentage of said component, and the sum of the first and second percentages equal one-hundred percent.

16. The method of claim 1, wherein, for each component tagged for offset symmetric placement on one side of the global symmetry line a distance D from the global symmetry line, step (c) includes placing said component on the one side of the global symmetry line with the side of the component in opposition with the global symmetry line positioned the distance D from the global symmetry line.

17. The method of claim 1, further including:
  defining an isolation structure along at least one side of at least one component; and
  in step (d), placing the one side of said at least one component no closer to another component or the global symmetry line than said isolation structure.

18. The method of claim 1, further including:
  amending the tree structure in at least one of the following manners:
  (1) changing a direction of at least one slicing line;
  (2) re-tagging at least one component from placement on the first side of the global symmetry line to placement on the second side of the global symmetry line, or vice versa;
  (3) exchanging the location of two components in the tree structure;
  (4) exchanging the location of one leaf and one interior node, and any interior node and/or leaf connected to said one interior node; and
  (5) exchanging the width and height of a component associated with at least one leaf; and
  repeating steps (c) and (d) for the amended tree structure.

19. A computer-implemented method for determining component placement in a circuit comprising:
  (a) receiving a plurality of components, with each component having associated therewith a width, a height and one of a symmetric and a non-symmetric placement constraint;
  (b) creating a tree structure that expresses the placement constraints for the plurality of components, wherein each component associated with a leaf of the group tree structure is tagged for placement on a first side, a second side, or on both sides of the local symmetry line; the tree structure including:
    a global root node that represents a global symmetry line,
    a leaf representing each component, with the component associated with each leaf tagged for placement on a first side, a second side, or on both sides of the global symmetry line, and
    at least one interior node that represents a slicing line that establishes a relative placement of at least two components with respect to each other on the same side of the global symmetry line; wherein the tree structure includes a group which is tagged for placement on the first side, the second side, or both sides of the global symmetry line; the group includes a group tree structure having at least one leaf connected to a local root node that represents a local symmetry line;
  (c) performing at least one structured search of the tree structure to determine the initial placement of components on the first side, the second side or both sides of the global symmetry line based on the tagging of each component and the connections of the leaves, the global root node and the interior nodes to form we tree structures; and
  (d) performing another structure search of the tree structure to determine the final placement of components based on at least one of the widths and heights of the components; and the method further includes;
    performing at least one structured search of the group tree structure to determine an initial placement of each component thereof on the first side, the second side or both sides of the local symmetry line based on the tagging thereof; and
    performing another structured search of the group tree structure to determine a final placement of each component thereof based on at least one of the widths and the heights of the components.

20. The method of claim 19, wherein:
  the group tree structure includes at least one local interior node connected between the local root node and the at least one leaf; and
  the step of performing at least one structured search of the group tree structure includes placing at least two components associated with the group tree structure with respect to each other as a function of a direction of a slicing line represented by the at least one local interior node of the group tree structure.

21. The method of claim 19, wherein:
step (c) includes performing the at least one structured search of the tree structure to determine the initial placement of the group on the first side, the second side, or both sides of the global symmetry line based on the tagging thereof; and
step (d) includes performing the other structured search of the tree structure to determine the final placement of the group.

22. The method of claim 21, wherein step (d) includes substituting for the final placement of the group the final placement of the components associated therewith.

23. The method of claim 22, wherein, at least one of:
the local root node is connected directly to either the root node or one of the interior nodes of the tree structure; or
the at least one leaf of the group tree structure is connected directly to the local root node.

24. A computer-implemented method for determining component placement in a circuit comprising:
(a) receiving a plurality of components each having one of a symmetric and a non-symmetric placement constraint associated therewith;
(b) creating a tree structure according to a global symmetry line that expresses the placement constraints for the plurality of components, the tree structure including a plurality of nodes and a plurality of leaves wherein:
the plurality of nodes includes a global root node that represents the global symmetry line and a local root node connected to the global root node,
the local root node represents a local symmetry line,
a group tree structure including the local root node and at least one leaf connected thereto is tagged for placement on a first side, a second side or on both sides of the global symmetry line, and
each leaf represents one of the components, with the component associated with each leaf of the group tree structure tagged for placement on a first side, a second side or on both sides of the local symmetry line, with the component associated with each leaf of the group tree structure having at least one of a height and a width associated therewith;
(c) performing at least one structured search of the group tree structure to determine the initial placement of components thereof on the first side, the second side or both sides of the local symmetry line based on the tagging of each component; and
(d) performing another structured search of the group tree structure to determine the final placement of the components thereof based on at least one of the widths and heights of the components.

25. The method of claim 24, further including:
performing at least one structured search of the tree structure to determine the initial placement of the group tree structure on the first side, the second side or both sides of the global symmetry line based on the tagging of the group tree structure; and
performing another structured search of the tree structure to determine the final placement of the group tree structure.

26. The method of claim 24, further including substituting the final placement of the components of a group tree structure for the final placement of the group tree structure.

27. A computer-implemented method for determining component placement in a circuit comprising:
(a) forming in the memory of the computer a tree structure that defines the placement of each of a plurality of components associated with the tree structure on a first side, a second side, or symmetrically on both sides of a symmetry line, with at least one component tagged for symmetric placement on both sides of the symmetry line;
(b) performing at least one search of the tree structure to determine an initial placement of a subset of the components on the first side, the second side, or on both sides of the global symmetry line; and
(c) performing another search of the tree structure to determine a final placement of the subset of components, wherein at least a part of each component tagged for symmetric placement is positioned on each side of the global symmetry line.

28. The method of claim 27, wherein each search is a depth-first search.

29. The method of claim 27, wherein:
the tree structure has a leaf for each component and at least one node connecting the leaves; and
the initial placement of the components occurs as a function of a vertical or horizontal line associated with at least one of a root node and an interior node of the tree structure.

30. The method of claim 29, further including:
(d) forming a new tree structure in at least one of the following manners:
(1) changing a direction of a line associated with at least one of the nodes of the tree structure;
(2) amending the tree structure to re-define the placement of at least one component from one side of the global symmetry line to the other side of the global symmetry line;
(3) exchanging the location of two leaves in the tree structure;
(4) exchanging the location of two nodes in the tree structure;
(5) exchanging the location of a leaf and a node in the tree structure; and
(6) exchanging the width and height of a component associated with a leaf of the tree structure; and
(e) repeating steps (b) and (c) for the new tree structure.

31. The method of claim 30, further including:
repeating steps (d) and (e) a plurality of times;
determining for each tree structure a cost that is related to the goodness of the final placement of the subset of components made utilizing said tree structure; and
selecting for implementation the final placement of the subset of components made utilizing the tree structure having the most favorable cost associated therewith.

32. The method of claim 31, wherein the cost for each tree structure is a ratio of (1) a total area of the subset of components in the final placement and (2) a total area of a rectangle that bounds the subset of components in the final placement.

33. The method of claim 27, wherein the symmetric placement includes one of:
pair-symmetric placement;
self-symmetric placement; and
asymmetric placement.

34. A computer readable medium having stored thereon instructions which, when executed by a processor, cause the processor to perform the steps of:

(a) receive data regarding a plurality of components, with the data for each component having associated therewith a width, a height and one of a symmetric and a non-symmetric placement constraint for the component;
(b) create a tree structure according to a global symmetry line that expresses the placement constraints for the plurality of components, the tree structure including:
a global root node that represents the global symmetry line,
a leaf representing each component, with the component associated with each leaf tagged for placement on a first side, a second side, or on both sides of the global symmetry line, and
at least one interior node that represents a slicing line that establishes a relative placement of at least two components with respect to each other on the same side of the global symmetry line;
(c) perform at least one structured search of the tree structure to determine the initial placement of components on the first side, the second side or both sides of the global symmetry line based on the tagging of each component; and
(d) perform another structured search of the tree structure to determine the final placement of components based on at least one of the widths and heights of the components.

35. A computer readable medium having stored thereon instructions which, when executed by a processor, cause the processor to perform the steps of:
(a) receive data regarding a plurality of components, with the data for each component including one of a symmetric and a non-symmetric placement constraint for the component;
(b) create a tree structure according to a global symmetry line that expresses the placement constraints for the plurality of components, the tree structure including a plurality of nodes and a plurality of leaves wherein:
the plurality of nodes includes a global root node that represents the global symmetry line and at least one local root node connected to the global root node,
the local root node represents a local symmetry line,
a group tree structure includes the local root node and at least one leaf connected thereto, where the group tree structure is tagged for placement on a first side, a second side or on both sides of the global symmetry line, and
each leaf represents one of the components, with the component associated with each leaf of the group tree structure tagged for placement on a first side, a second side or on both sides of the local symmetry line, with the component associated with each leaf of the group tree structure having at least one of a height and a width associated therewith;
(c) perform at least one structured search of the group tree structure to determine the initial placement of components thereof on the first side, the second side or both sides of the local symmetry line based on the tagging of each component; and
(d) perform another structured search of the group tree structure to determine the final placement of the components thereof based on at least one of the widths and heights of the components.

36. A computer readable medium having stored thereon instructions which, when executed by a processor, cause the processor to perform the steps of:
(a) form in the memory of the computer a tree structure which defines the placement of each of a plurality of components associated with the tree structure on a first side, a second side or symmetrically on both sides of a global symmetry line, with at least one component tagged for symmetric placement on both sides of a global symmetry line;
(b) perform a search of the tree structure to determine an initial placement of a subset of the components on the first side, the second side or on both sides of the global symmetry line; and
(c) perform another search of the tree structure to determine a final placement of the subset of components, wherein at least one of a copy of or a part of each component tagged for symmetric placement is positioned on each side of the global symmetry line.

37. The method of claim 36, wherein the instructions further cause the processor to perform the steps of:
(d) form a new tree structure in at least one of the following manners:
(1) amend component placement information associated with at least one of the nodes of the tree structure;
(2) amend the tree structure to re-define the placement of at least one component from one side of the global symmetry line to the other side of the global symmetry line;
(3) exchange the positions of two leaves in the tree structure;
(4) exchange the positions of two nodes in the tree structure;
(5) exchange the positions of a leaf and a node in the tree structure; and
(6) exchange a width and a height of a component associated with a leaf of the tree structure; and
(e) repeat steps (b) and (c) for the new tree structure.

38. The method of claim 37, wherein the instructions further cause the processor to perform the steps of:
repeat steps (d) and (e) a plurality of times;
determine for each tree structure a cost that is related to the goodness of the final placement of the subset of components made utilizing said tree structure; and
select the final placement of the subset of components made utilizing the tree structure having the most favorable cost associated therewith.

* * * * *